United States Patent
Matsumoto

(10) Patent No.: US 8,294,983 B2
(45) Date of Patent: Oct. 23, 2012

(54) OPTICAL AMPLIFIER USING PHOTOELECTRIC EFFECT OF SURFACE PLASMON RESONANCE PHOTONS AND ITS MANUFACTURING METHOD

(75) Inventor: Takahiro Matsumoto, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 561 days.

(21) Appl. No.: 12/472,481

(22) Filed: May 27, 2009

(65) Prior Publication Data
US 2009/0296200 A1 Dec. 3, 2009

(30) Foreign Application Priority Data

May 28, 2008 (JP) .................................. 2008-138992

(51) Int. Cl.
*H04B 10/17* (2006.01)
*H04B 10/12* (2006.01)

(52) U.S. Cl. ........................................ 359/342; 359/344

(58) Field of Classification Search .................. 359/342, 359/344
See application file for complete search history.

(56) References Cited

U.S. PATENT DOCUMENTS

| | | | | |
|---|---|---|---|---|
| 4,641,312 A * | 2/1987 | Schafer et al. | .................. | 372/25 |
| 5,231,533 A * | 7/1993 | Gonokami et al. | ............ | 359/328 |
| 5,991,488 A * | 11/1999 | Salamon et al. | .............. | 385/129 |
| 6,330,387 B1 * | 12/2001 | Salamon et al. | .............. | 385/129 |
| 6,421,128 B1 * | 7/2002 | Salamon et al. | .............. | 356/445 |
| 6,956,808 B2 * | 10/2005 | Miyanishi et al. | ............ | 369/121 |
| 7,949,210 B2 * | 5/2011 | Durfee et al. | ...................... | 385/1 |
| 2002/0008215 A1 * | 1/2002 | Evans | ...................... | 250/559.13 |
| 2002/0048304 A1 * | 4/2002 | Barnes et al. | .................... | 372/99 |
| 2004/0141300 A1 * | 7/2004 | Takubo et al. | .................... | 362/5 |
| 2004/0257965 A1 * | 12/2004 | Miyanishi et al. | ............ | 369/121 |
| 2007/0096087 A1 * | 5/2007 | Catrysse et al. | ................ | 257/40 |
| 2007/0146866 A1 * | 6/2007 | Wright | ......................... | 359/332 |

FOREIGN PATENT DOCUMENTS

JP 04-046034 A 2/1992
JP 04-213884 A 8/1992

OTHER PUBLICATIONS

Ter-Mikirtychev, "Surface Plasmon Assisted Optical Amplifier and Oscillator Based on Barium Nitrate Crystal", Nonlinear Optics: Material Fundamentals, and Applications, Technical Digest. Postconference edition. vol. 46, p. 245-6, (Aug. 2000).*
H. Raether; Surface Plasmons on Smooth and Rough Surfaces and on Gratings; vol. 111; Springer Tracts in Modern Physics; pp. 16-19; 1988.

* cited by examiner

*Primary Examiner* — Eric Bolda
(74) *Attorney, Agent, or Firm* — Holtz, Holtz, Goodman & Chick, PC

(57) ABSTRACT

In an optical amplifier including a metal layer having an incident/reflective surface adapted to receive incident light and output its reflective light, and a dielectric layer formed on an opposite surface of the metal layer opposing the incident/reflective surface, the incident light excites surface plasmon resonance light in the metal layer while the dielectric layer is excited, so that an extinction coefficient of the dielectric layer is made negative.

16 Claims, 18 Drawing Sheets

OPTICAL AMPLIFIER USING PHOTOELECTRIC EFFECT OF SURFACE PLASMON RESONANCE PHOTONS AND ITS MANUFACTURING METHOD

BACKGROUND OF THE INVENTION

1. Field of the Invention

The present invention relates to an optical amplifier capable of directly amplifying an optical signal in an optical communication system and its manufacturing method.

2. Description of the Related Art

As optical amplifiers, a prior art optical fiber amplifier and a prior art optical waveguide-type amplifier have been known (see: JP 4-46034 A and JP 4-213884 A). The prior art optical fiber amplifier and the prior art optical waveguide-type amplifier will be explained later in detail.

In the prior art optical fiber amplifier and the prior art optical waveguide-type amplifier, however, the intensity of an output light signal is small.

SUMMARY OF THE INVENTION

The present invention seeks to solve one or more of the above-described problems.

According to the present invention, an optical amplifier is constructed by a metal layer having an incident/reflective surface adapted to receive incident light and output its reflective light; and a dielectric layer formed on an opposite surface of the metal layer opposing the incident/reflective surface, the incident light exciting surface plasmon resonance light in the metal layer while the dielectric layer is excited so that an extinction coefficient of the dielectric layer is made negative.

Also, an incident angle of the incident light to the metal layer is a light absorption dip angle by which a reflectivity of the incident light at the incident/reflective surface of the metal layer is minimum in a total reflection region while the dielectric layer is not excited. Thus, the excited amount of surface plasmon resonance photons is maximum.

Further, a thickness of the metal layer is determined so that the reflectivity of the incident light at the incident/reflective surface of the metal layer is minimum when the incident light is incident at the light absorption dip angle to the incident/reflective surface of the metal layer while the dielectric layer is not excited. Thus, the excited amount of surface plasmon resonance photons is maximum.

The metal layer comprises a gold (Au) layer.

The dielectric layer comprises an organic dye layer or a semiconductor layer.

Further, a resonator layer is deposited on an opposite surface of the dielectric layer opposing the metal layer. The resonator layer comprises a silver (Ag) layer or a dielectric multi-layer mirror structure.

Also, according to the present invention, in a method for manufacturing an optical amplifier, comprising a metal layer having an incident/reflective surface adapted to receive incident light and output its reflective light; and a dielectric layer deposited on an opposite surface of the metal layer opposing the incident/reflective surface, the incident light exciting surface plasmon resonance light in the metal layer while the dielectric layer is excited so that an extinction coefficient of the dielectric layer is made negative, a thickness of the metal layer is determined, so that the reflectivity of the incident light at the incident/reflective surface of the metal layer is minimum in a total reflection region when the incident light is incident to the incident/reflective surface of the metal layer while the dielectric layer is not excited. Then, at least one candidate of an incident angle of the incident light to the metal layer and a thickness of the dielectric layer is determined, so that the reflectivity of the incident light at the incident/reflective surface of the metal layer is minimum in the total reflection region while the determined thickness of the metal layer is maintained and the dielectric layer is not excited. Finally, a negative extinction coefficient of the dielectric layer corresponding to an excited state of the dielectric layer is determined, so that the reflectivity of the incident light at the incident angle of the candidate is beyond a predetermined value while the thickness of the dielectric layer of the candidate is maintained.

Further, according to the present invention, in a method for manufacturing an optical amplifier including a metal layer having an incident/reflective surface adapted to receive incident light and output its reflective light, a dielectric layer deposited on an opposite surface of the metal layer opposing the incident/reflective surface, and a resonator layer deposited on an opposite surface of the dielectric layer opposing the metal layer, the incident light exciting surface plasmon resonance light in the metal layer while the dielectric layer is excited so that an extinction coefficient of the dielectric layer is made negative, a thickness of the resonator layer is determined in accordance with a predetermined transmittivity of the resonator layer. Then, a thickness of the dielectric layer is determined. Then, an incident angle of the incident light at the incident/reflective surface of the metal layer and a thickness of the metal layer a redetermined, so that the reflectivity of the incident light at the incident/reflective surface of the metal layer is minimum in a total reflection region when the incident light is incident to the incident/reflective surface of the metal layer while the dielectric layer is not excited. Finally, a negative extinction coefficient of the dielectric layer corresponding to an excited state of the dielectric layer is determined, so that the reflectivity of the incident light at the incident angle is beyond a predetermined value while the incident angle of the incident light at the incident/reflective surface of the metal layer and the thickness of the dielectric layer are maintained.

BRIEF DESCRIPTION OF THE DRAWINGS

The above and other objects, advantages and features of the present invention will be more apparent from the following description of certain preferred embodiments, as compared with the prior art, taken in conjunction with the accompanying drawings, wherein.

DETAILED DESCRIPTION OF PREFERRED EMBODIMENTS

Before the description of the preferred embodiments, prior art optical amplifiers will now be explained with reference to FIGS. 1 and 2.

Figure 1:
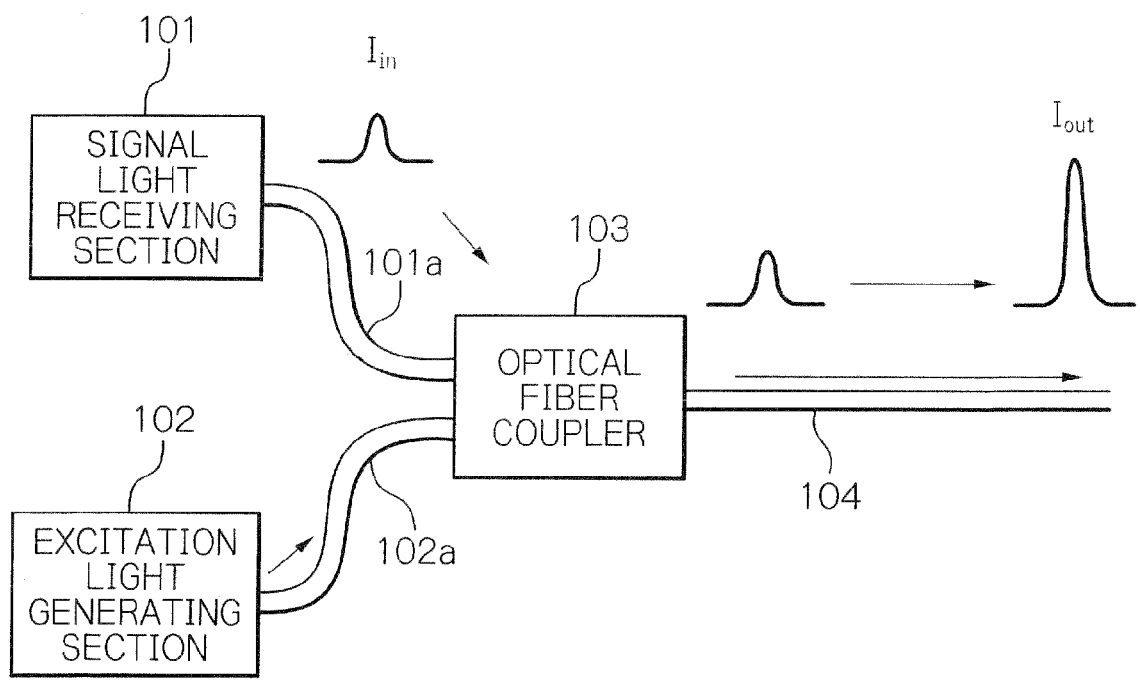
FIG. 1 is a block diagram illustrating a prior art optical fiber amplifier.

In FIG. 1, which illustrates a prior art optical fiber amplifier (see: JP-4-46034 A), reference numeral 101 designates a signal light receiving section for receiving signal light, 102 designates an excitation light generating section formed by a semiconductor laser for generating excitation light or pumping light, 103 designates an optical fiber coupler coupling an optical fiber 101a propagating the signal light to an optical fiber 102a propagating the excitation light, and 104 designates a rare earth metal-doped optical fiber or erbium-doped optical fiber for amplifying the signal light with the excitation light. In the rare earth metal-doped optical fiber of FIG. 1, the amplification of the signal light is carried out by using a transition between excitation levels of population inversion of the rare earth metal excited by the excitation light.

Figure 2:
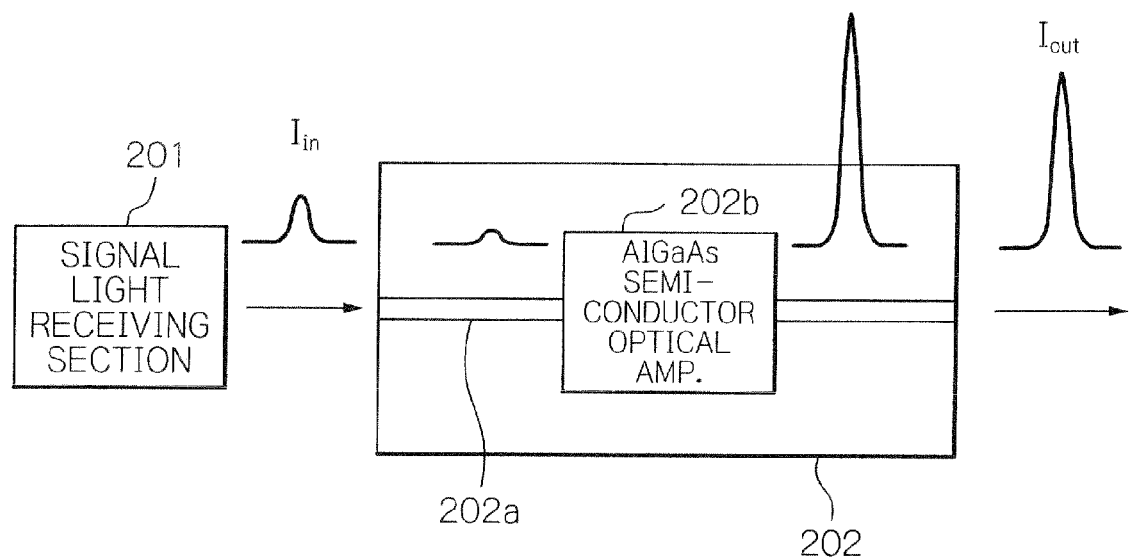
FIG. 2 is a block diagram illustrating a prior art optical waveguide-type amplifier.

In FIG. 2, which illustrates a prior art optical waveguide-type amplifier (see: JP-4-213884 A), reference numeral 201 designates a signal light receiving section for receiving signal light, and 202 designates an optical circuit board formed by an optical waveguide 202a in which an AlGaAs semiconductor optical amplifier 202b is buried. In the optical waveguide-type amplifier of FIG. 2, the signal light is amplified by a current injection.

In the optical amplifier of FIG. 1 and the optical waveguide-type amplifier of FIG. 2, an output light intensity $I_{out}$ is represented by $I_{out} = I_{in} \exp(\alpha d)$ where $I_{in}$ is the intensity of the signal light;
α is a gain coefficient (cm$^{-1}$); and
d is an interaction length (cm).

In the optical amplifier of FIG. 1, although the interaction length d can be large, the gain coefficient α is small or about 0.01 to 0.001, so that the output light intensity $I_{out}$ is small.

In the optical waveguide-type amplifier of FIG. 2, although the gain coefficient α can be large or about 100 to 10000, the interaction length d is small, so that the output light intensity $I_{out}$ is small.

Figure 3:
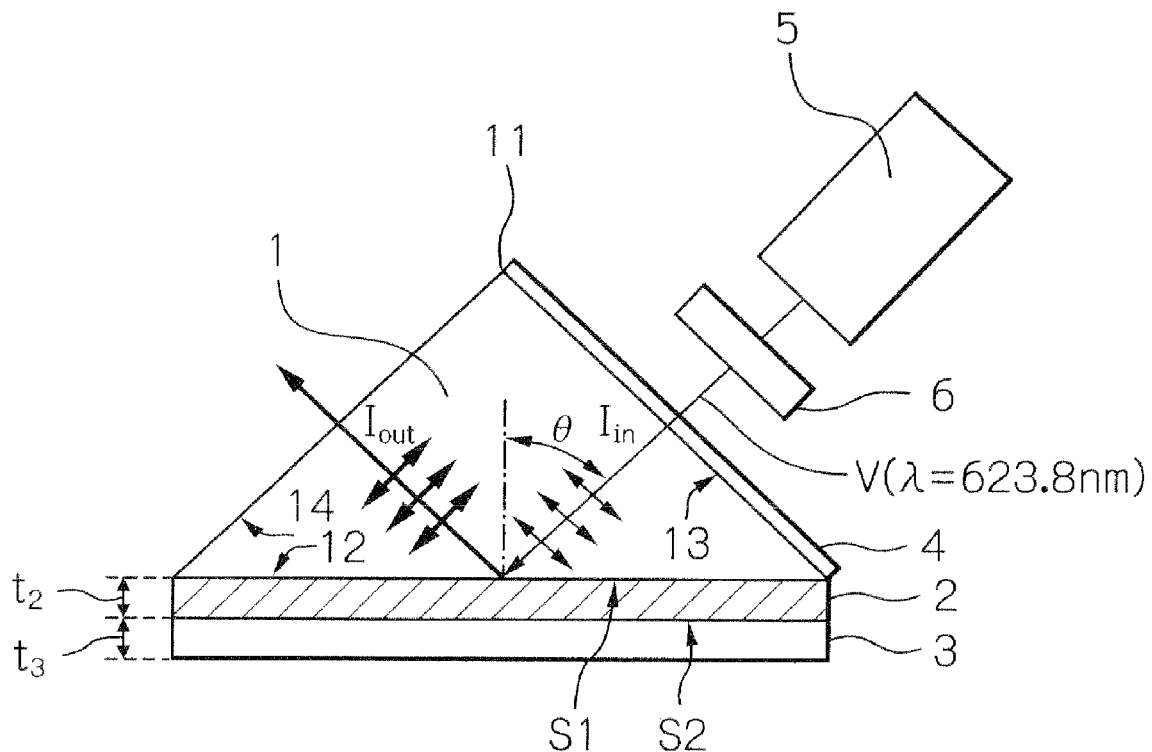
FIG. 3 is a cross-sectional view illustrating a first embodiment of the optical amplifier according to the present invention.

In FIG. 3, which illustrates a first embodiment of the optical amplifier according to the present invention, this optical amplifier is constructed by a common glass prism or a BK-7 prism 1 as a transparent body for visible laser rays with a refractive index $n_1$ of 1.535 and a vertical angle of 90°, a gold (Au) layer 2 as a metal layer deposited by an evaporating process or the like on a surface 12 of the BK-7 prism 1 opposing the arris 11 thereof, and an organic dye layer 3 made of rhodamine B, for example, as a dielectric layer deposited on a surface S2 of the Au layer 2 opposing the incident/reflective surface S1 thereof.

The Au layer 2 is about 1 cm long and about 10 nm to 10 μm thick. If the thickness $t_2$ of the Au layer 2 is smaller than 10 nm, the Au layer 2 cannot sufficiently absorb evanescent photons generated therein. On the other hand, if the thickness $t_2$ of the Au layer 2 is larger than 10 μm, the generation of evanescent photons in the Au layer 2 is attenuated, so as not to excite surface plasmon resonance (SPR) photons in the Au layer 2.

Note that an about 1 to 2 nm thick metal layer made of Cr or the like may be deposited on the surface of the BK-7 prism 1 to enhance the contact characteristics between the Au layer 2 and the BK-7 prism 1.

An antireflection (AR) coating layer 4 is coated on a surface 13 of the BK-7 prism 1. In this case, the arris 11 of the BK-7 prism 1 is formed by the surface 13 as well as a surface 14. Note that, if the incident loss by the reflectivity such as 8% of the BK-7 prism 1 is negligible, the AR coating layer 4 can be omitted.

Further, a He—Ne laser source 5 and a wavelength plate 6 are provided. As a result, a visible laser ray V whose wavelength λ is 623.8 nm is emitted from the He—Ne laser source 5 and is incident via the wavelength plate 6, the AR coating layer 4 and the BK-7 prism 1 to the Au layer 2. In this case, in order to generate evanescent photons in the Au layer 2, the rotational angle of the wavelength plate 6 can be adjusted, so that the visible laser ray V incident to the Au layer 2 is polarized, i.e., TM-polarized or P-polarized in parallel with the incident/reflective surface S1 of the Au layer 2.

Note that, since the visible laser ray V is linearly-polarized, the rotational angle of the He—Ne laser source 5 can be adjusted without provision of the wavelength plate 6 to emit the above-mentioned P-polarized light.

In the Au layer 2, surface plasmon resonance (SPR) photons are excited by incident light, and, in the organic dye layer 3, a population inversion state is realized by the excitation due to the irradiation of an additional laser ray (pumping light) or a current injection. Therefore, the extinction coefficient $k_3$ of the organic dye layer 3 is made negative. As a result, the output light (reflective light) intensity $I_{out}$ at the incident/reflective surface S1 of the Au layer 2 is about $10^3$ to $10^5$ times the incident light intensity $I_{in}$ in accordance with the negative extinction coefficient $k_3$ of the organic dye layer 3. This is considered a resonance state between the SPR photons and the excitation state or population inversion state of the organic dye layer 3.

The organic dye layer 3 is formed by using a spin coating technology for depositing a host material called binaphthyl-poly(9,9-dioctylfluorene) (BN-POF) into an organic material in which rhodamine B is doped.

The operational principle of the optical amplifier of FIG. 3 is to generate evanescent photons in the Au layer 2 by the visible laser ray V to excite photons on the surface S2 of the Au layer 2. In this case, since the visible laser ray V is P-polarized, the visible laser ray V has an electric field component in parallel with the surface of the Au layer 2 and another electric field perpendicular to the surface of the Au layer 2, so that the respective electric fields are amplified. For example, the intensity of the electric field of a light incident to the Au layer 2 is made to be about ten times by the SPR photons generated therein. Therefore, since the intensity of the light incident to the Au layer 2 is represented by a square value of the electric field, the light incident to the Au layer 2 is amplified by about 100 ($=10\times10$) times.

Regarding the surface plasmon resonance (SPR) photons, reference is made to Heinz Raether, "Surface Plasmons on Smooth and Rough Surfaces and on Gratings", Springer-Verlag Berlin Heidelberg New York, pp. 16-19, 1988.

Note that, since the wavelength $\lambda$ of the visible laser ray V of the He—Ne laser source 5 is 632.8 nm and the wavelength of SPR photons of Au is about 600 to 1000 nm, the SPR photons would be excited.

Figure 4:
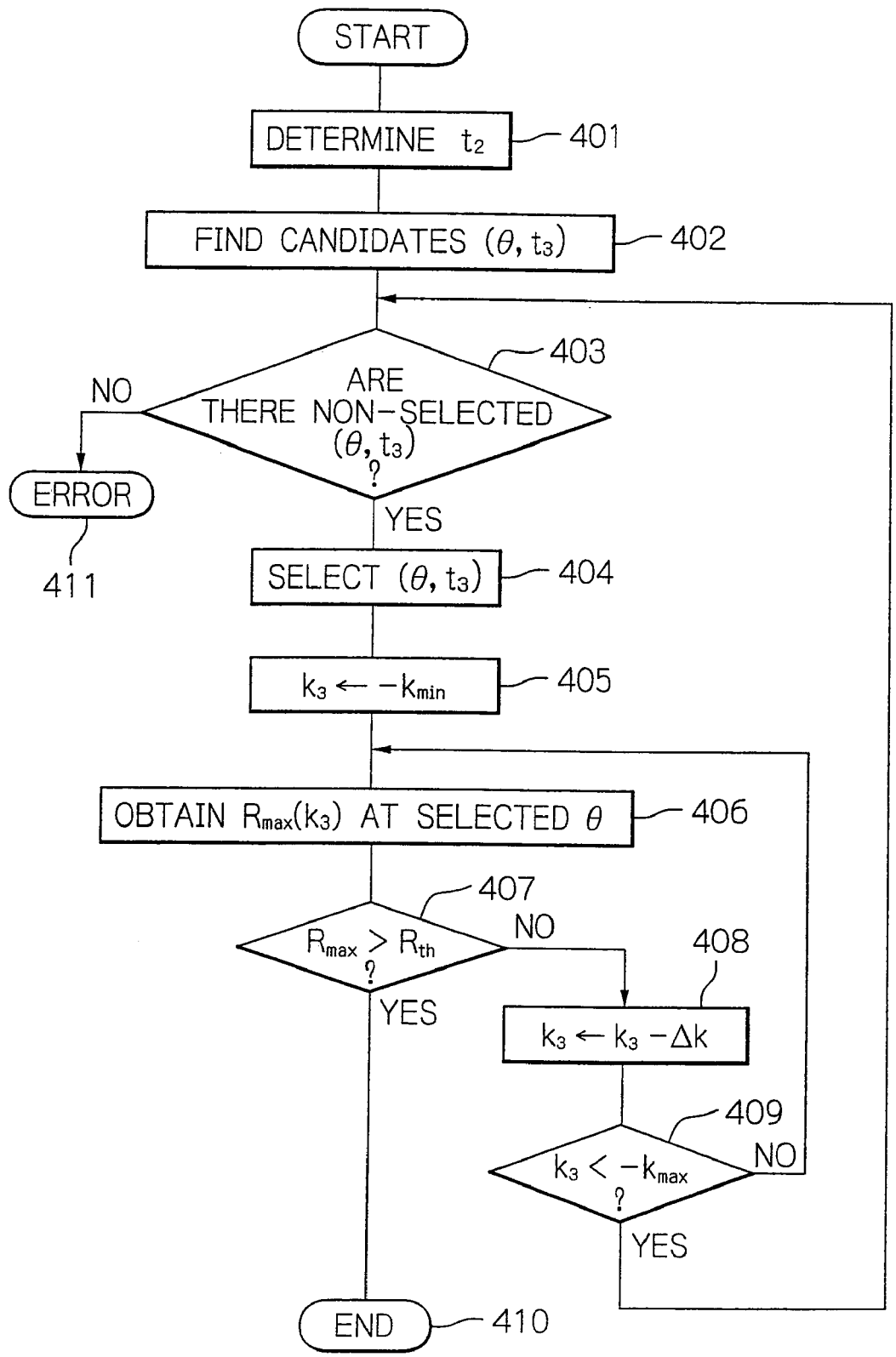
FIG. 4 is a flowchart for explaining a method for manufacturing the optical amplifier of FIG. 3.

FIG. 4 is a flowchart for explaining a method for manufacturing the optical amplifier of FIG. 3.

First, at step 401, an optimum thickness $t_2$ of the Au layer 2 is determined. That is, if the incident angle $\theta$ of the visible laser ray V at the incident/reflective surface S1 of the Au layer 2 is an optimum incident angle $\theta_{opt}$ ($>\theta_c$ where $\theta_c$ is a critical angle), the number of SPR photons excited on the surface S2 of the Au layer 2 of FIG. 3 is maximum. In other words, when $\theta=\theta_{opt}>\theta_c$, the reflectivity R at the incident/reflective surface S1 of the Au layer 2 is minimum. In this case, FIG. 5 was obtained by a simulation which calculates a reflectivity R of light reflected from the incident/reflective surface S1 of the Au layer 2 by angularly scanning the BK-7 prism 1 with the visible laser ray V. This simulation can be carried out by the simulation software WinSpall (trademark) developed by Max Planck Institute.

Figure 5:
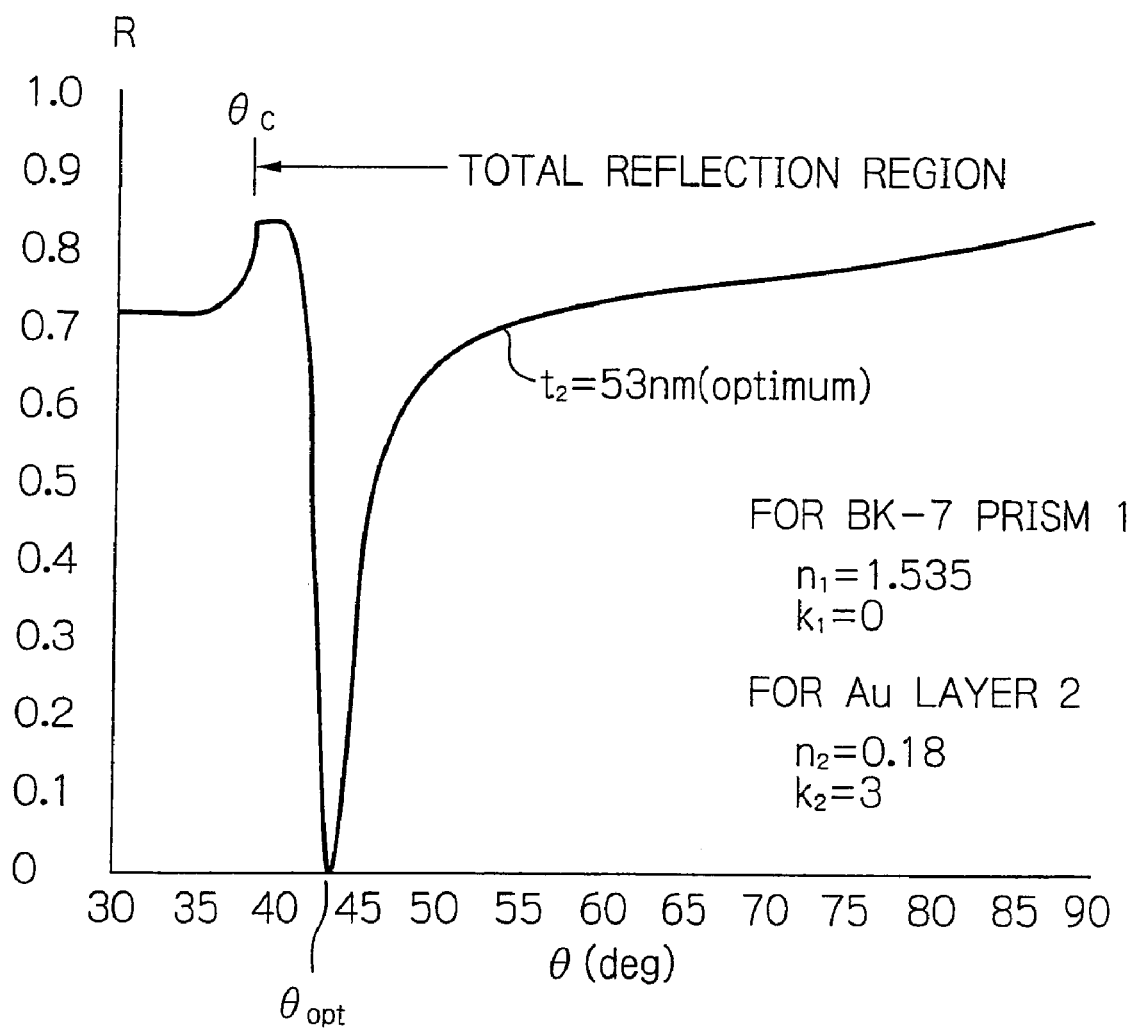
FIG. 5 is an attenuated total reflection (ATR) signal spectrum diagram for explaining determination of the thickness $t_2$ of the Au layer at step 401 of FIG. 4.

In FIG. 5, the simulation conditions are as follows:
1) The wavelength $\lambda$ of the visible laser ray V is 632.8 nm.
2) For the BK-7 prism 1,
   the refractive index $n_1$ is 1.53; and
   the extinction coefficient $k_1$ is 0.
3) For the Au layer 2,
   the refractive index $n_2$ is 0.18;
   the extinction coefficient $k_2$ is 3; and
   the thickness $t_2$ is variable.
4) For the organic dye layer 3,
   the thickness $t_3$ is 0.

That is, the organic dye layer 3 is assumed to be absent.

In FIG. 5, only one ATR signal spectrum of the Au layer 2 whose thickness $t_2$ is 53 nm is selected from a plurality of ATR signal spectrums of the Au layer 2 whose thickness $t_2$ is variable. That is, the ATR signal spectrum of FIG. 5 shows that, if the thickness $t_2$ of the Au layer 2 is smaller than 10 nm, the Au layer 2 cannot sufficiently absorb evanescent photons generated therein, and if the thickness $t_2$ of the Au layer 2 is larger than 60 nm, the generation of evanescent photons in the Au layer 2 is attenuated, so as not to excite SPR photons in the Au layer 2, thus increasing the reflectivity at a plasmon dip. From FIG. 5, the ATR signal spectrum at $t_2=53$ nm shows a sharp plasmon dip where the reflectivity R is 0. Therefore, the thickness $t_2$ of the Au layer 2 is determined to be $53\pm1$ nm, so that the excited SPR photons are maximum.

Figure 6:
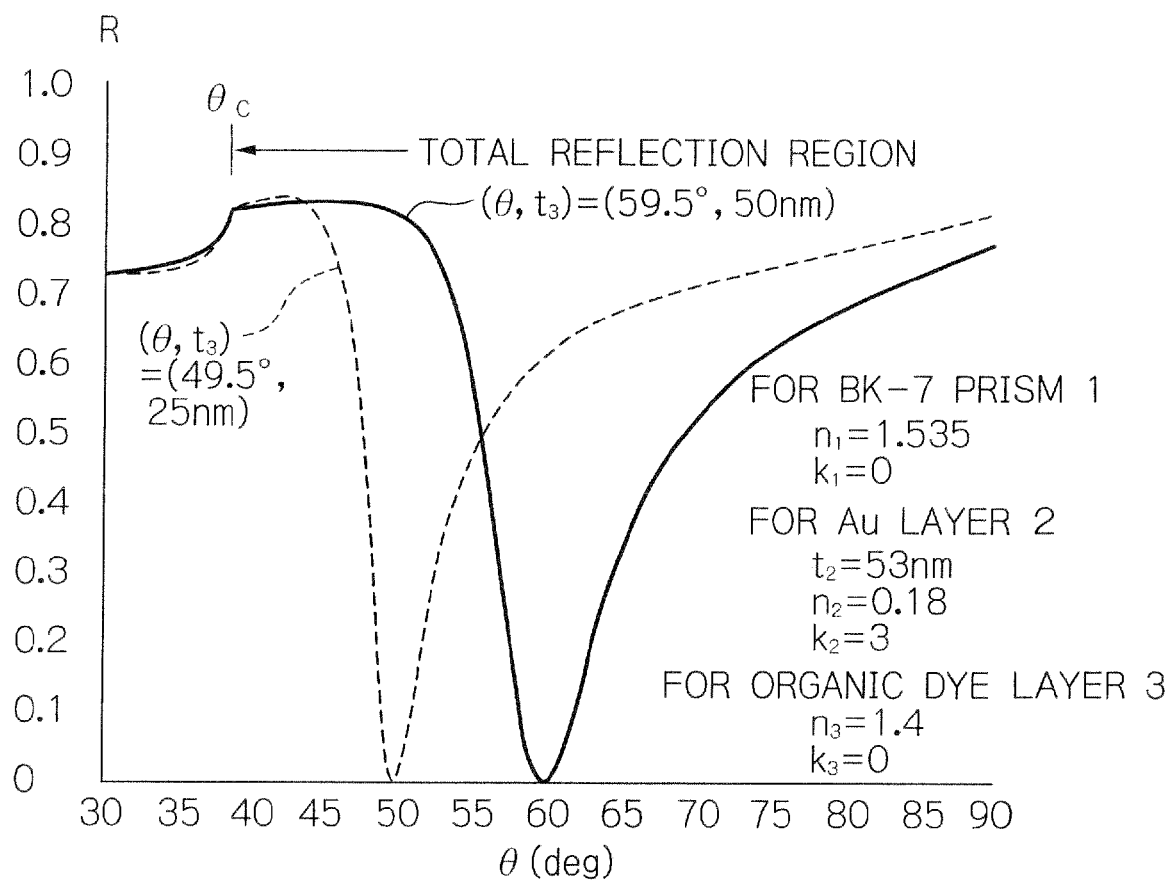
FIG. 6 is an ATR signal spectrum diagram for explaining candidates (the incident angle θ, the thickness $t_3$ of the organic dye layer) at step 402 of FIG. 4.

Next, at step 402, candidates ($\theta$, $t_3$) where $\theta$ is the incident angle and $t_3$ is the thickness of the organic dye layer 3 are found. This step is carried out under the condition that the organic dye layer 3 is in a non-excited state ($k_3=0$). FIG. 6 was obtained by a simulation using the above-mentioned simulation software WinSpall (trademark) which calculates a reflectivity R of light reflected from the incident/reflective surface S1 of the Au layer 2 by angularly scanning the BK-7 prism 1 with the visible laser ray V where the thickness $t_2$ of the Au layer 2 is fixed at 53 nm while the thickness $t_3$ of the organic dye layer 3 is changed from 0 to 50 nm. In order to simplify the description, only two ATR signal spectrums at $t_3=25$ nm and 50 nm are illustrated in FIG. 6.

In FIG. 6, the simulation conditions are as follows:
1) The wavelength $\lambda$ of the visible laser ray V is 632.8 nm.
2) For the BK-7 prism 1,
   the refractive index $n_1$ is 1.535; and
   the extinction coefficient $k_1$ is 0.
3) For the Au layer 2,
   the thickness $t_2$ is 53 nm;
   the refractive index $n_2$ is 0.18; and
   the extinction coefficient $k_2$ is 3.
4) For the organic dye layer 3,
   the thickness $t_3$ is variable;
   the refractive index $n_3$ is 1.4; and
   the extinction coefficient $k_3$ is 0.

As shown in FIG. 6, since the organic dye layer 3 has no absorption loss ($k_3=0$), when the thickness $t_3$ of the organic dye layer 3 is increased, the plasmon dip angle is shifted toward a higher angle where the depth of the plasmon dip is at a point of R=0, so that SPR photons can be excited regardless of the thickness $t_3$ of the non-excited organic dye layer 3. In order to simplify the description, it is assumed that only the following two candidates ($\theta$, $t_3$) are found:
  ($\theta$, $t_3$)=(49.5°, 25 nm)
  ($\theta$, $t_3$)=(59.5°, 50 nm)

If at least one candidate ($\theta$, $t_3$) is found, the flow proceeds from step 403 to step 404 which selects one candidate ($\theta$, $t_3$). Otherwise, the flow proceeds from step 403 to step 411 which indicates an error.

That is, step 403 determines whether there are still non-selected candidates among the candidates ($\theta$, $t_3$) found at step 402. If there is at least one non-selected candidate ($\theta$, $t_3$), the flow proceeds to step 404 which selects one candidate ($\theta$, $t_3$) from the non-selected candidates, and then, steps 405 through 409 determine the extinction coefficient $k_3$ of the organic dye layer 3, i.e., determines ($\theta$, $t_3$, $k_3$).

Note that the extinction coefficient $k_3$ of the organic dye layer 3 is defined by the intensity of its population inversion state which can be realized by irradiating the organic dye layer 3 with an additional pumping laser ray or injecting a current into the organic dye layer 3. That is, the extinction coefficient $k_3$ of the organic dye layer 3 is defined by $$k_3 = \eta_1 \cdot I$$

where I is the energy of the pumping laser ray or the injected current; and $\eta_1$ is a constant.

At step 405, the extinction coefficient $k_3$ of the organic dye layer 3 is initialized at $-k_{min}$ where $k_{min}$ is a positive value such as 0.001.

Next, at step 406, a reflectivity $R_{max}$ at the selected incident, angle $\theta$ is obtained. For example, an ATR signal spectrum ($\theta$, $t_3$, $k_3$) using the above-mentioned simulation software WinSpall (trademark) is calculated, and the reflectivity $R_{max}$ at the selected incident angle $\theta$ is obtained from this ATR signal spectrum. In this case, the reflectivity $R_{max}$ at the selected incident angle $\theta$ can be obtained by directly observing the reflectivity $R_{max}$.

Next, at step 407, it is determined whether or not $R_{max} > R_{th}$ where $R_{th}$ is a predetermined value such as 6E4 is satisfied. As a result, only when $R_{max} > R_{th}$, does the flow proceed to step 410 which completes the flowchart of FIG. 4. On the other hand, when $R_{max} \leq R_{th}$, the flow proceeds to steps 408 and 409 which renew the extinction coefficient $k_3$ by decreasing the extinction coefficient $k_3$ by $\Delta k$ such as 0.001, thus repeating the flow at steps 406 and 407. In this case, the extinction coefficient $k_3$ is guarded by step 409. That is, when $k_3 \geq -k_{max}$ where $k_{max}$ is a definite value such as 1.0, the flow proceeds from step 409 to steps 406 and 407. On the other hand, the flow proceeds from step 409 to step 403.

Thus, the extinction coefficient $k_3$ of the organic dye layer 3 is changed from $k_{min}$ to $k_{max}$, the extinction coefficient $k_3$ is determined at the time when the reflectivity $R_{max}$ reaches $R_{th}$.

Note that if it is determined at step 103 that there is no non-selected candidate ($\theta$, $t_3$), the flow proceeds to step 411, which means it is impossible to determine the extinction coefficient $k_3$ of the organic dye layer 3.

Figure 7A:
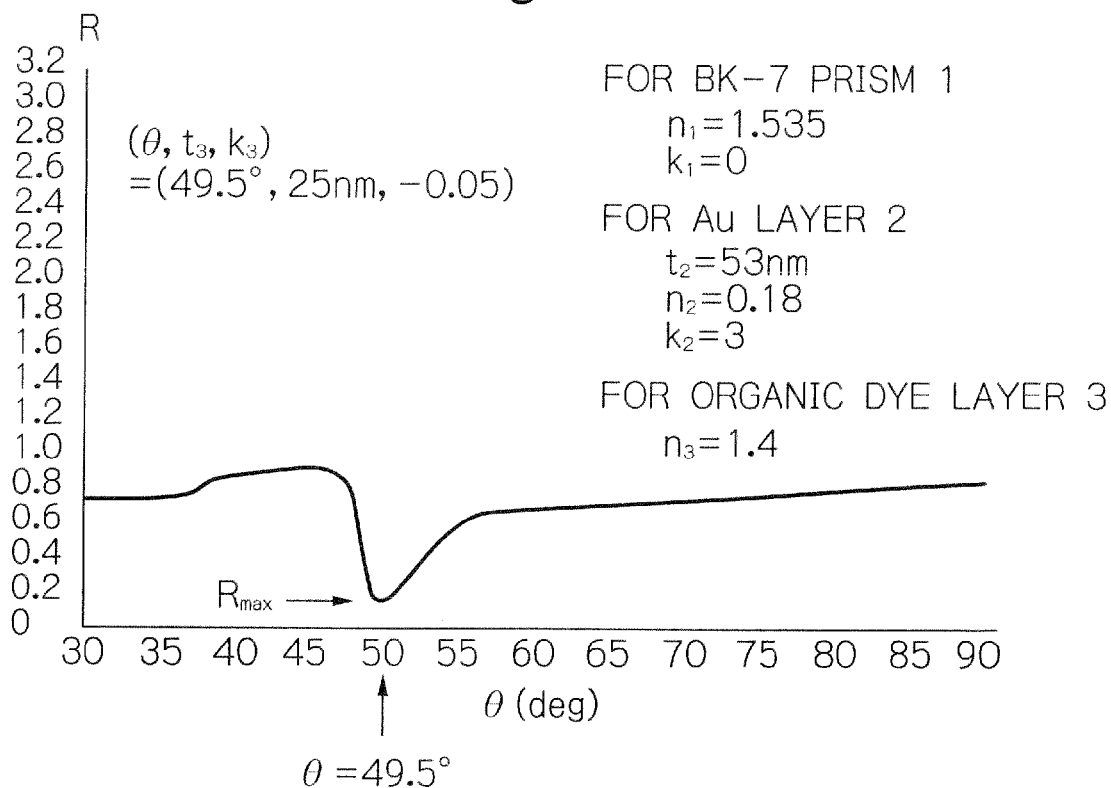
FIGS. 7A and 7B are ATR signal spectrum diagrams for explaining the reflectivity $R_{max}$ at the selected incident angle at step 406 of FIG. 4.

For example, when ($\theta$, $t_3$)=(49.5°, 25 nm) is selected at step 404 and $k_3$=−0.05 is obtained at step 408, an ATR signal spectrum as illustrated in FIG. 7A is obtained. In this case, the reflectivity $R_{max}$ at the selected incident angle $\theta$(=49.5°) is small, so that the flow proceeds via steps 408 and 409 to step 406.

Figure 7B:
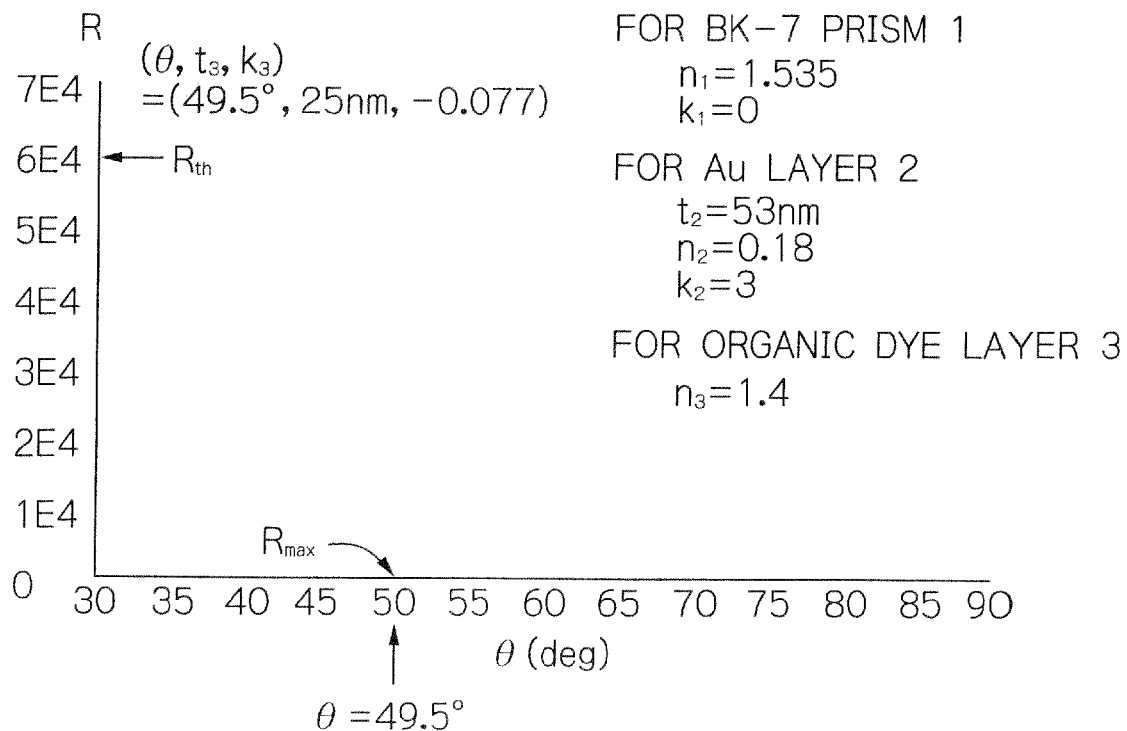

Next, when ($\theta$, $t_3$)=(49.5°, 25 nm) is maintained and $k_3$=−0.077 is obtained at step 408, an ATR signal spectrum as illustrated in FIG. 7B is obtained. Even in this case, the reflectivity $R_{max}$ at the selected incident angle $\theta$ (=49.5°) is small, so that the flow proceeds via steps 408 and 409 to step 406.

Figure 8A:
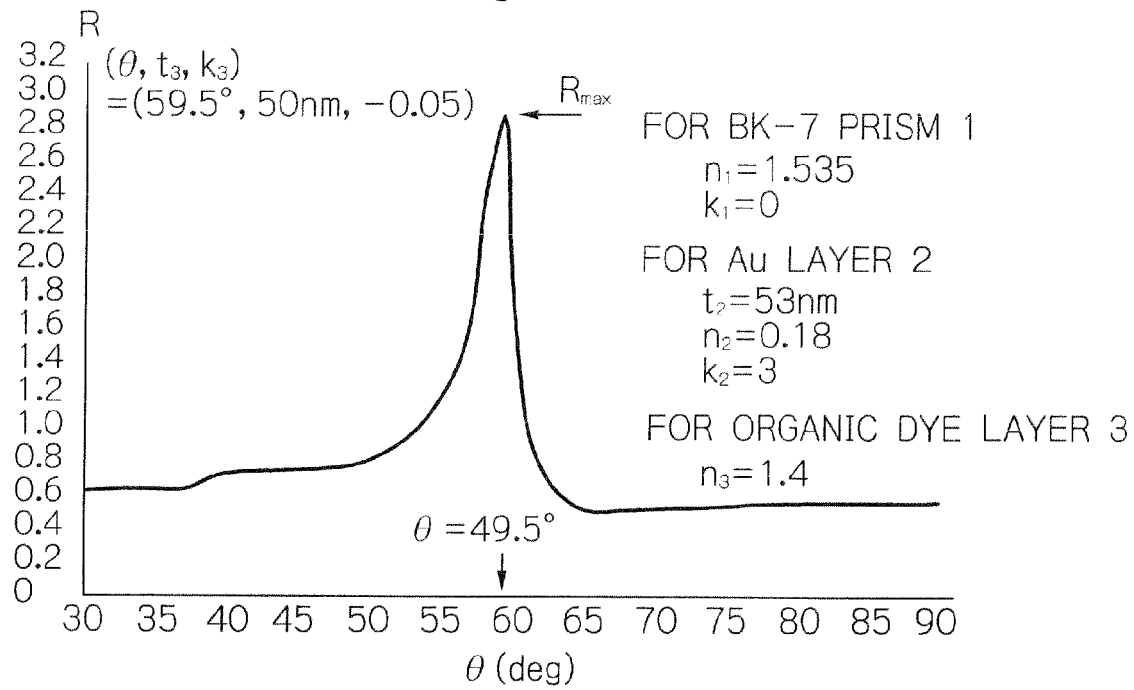
FIGS. 8A and 8B are ATR signal spectrum diagrams for explaining the reflectivity $R_{max}$ at the selected incident angle at step 406 of FIG. 4.

Next, when ($\theta$, $t_3$)=(59.5°, 50 nm) is selected at step 404 and $k_3$=−0.05 is obtained at step 408, an ATR signal spectrum as illustrated in FIG. 8A is obtained. Even in this case, the reflectivity $R_{max}$ at the selected incident angle $\theta$ (=59.5°) is small, so that the flow proceeds via steps 408 and 409 to step 406.

Figure 8B:
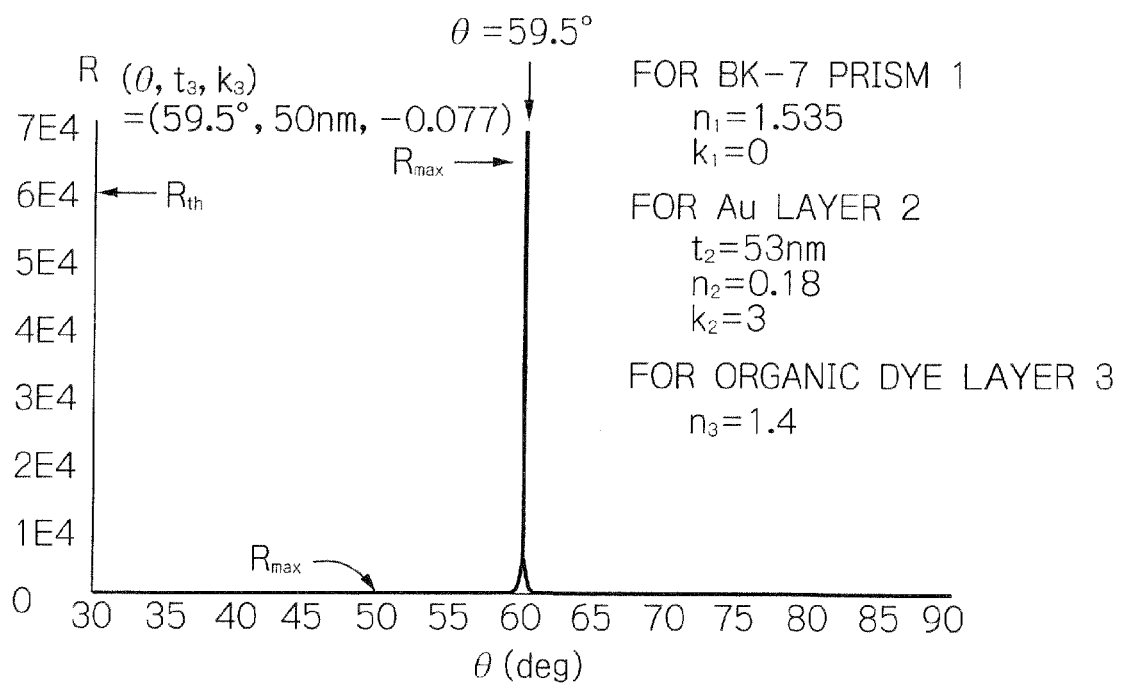

Finally, when ($\theta$, $t_3$)=(59.5°, 50 nm) is maintained and $k_3$=−0.077 is obtained at step 408, an ATR signal spectrum as illustrated in FIG. 8B is obtained. In this case, the reflectivity $R_{max}$ at the selected incident angle $\theta$ (=59.5°) is large, so that the flow proceeds to step 410.

Thus, ($\theta$, $t_3$, $k_3$)=(59.5°, 50 nm, −0.077) is finally determined.

In FIGS. 7A, 7B, 8A and 8B, note that the simulation conditions are as follows:
1) The wavelength $\lambda$ of the visible laser ray V is 632.8 nm.
2) For the BK-7 prism 1,
   the refractive index $n_1$ is 1.535; and
   the extinction coefficient $k_1$ is 0.
3) For the Au layer 2,
   the refractive index $n_2$ is 0.18;
   the extinction coefficient $k_2$ is 3; and
   the thickness $t_2$ is 53 nm.
4) For the organic dye layer 3,
   the refractive index $n_3$ is 1.4.

As stated above, the extinction coefficient $k_3$ of the organic dye layer 3 can be changed in accordance with the excitation intensity thereof. In this case, in the optical amplifier using the organic dye layer 3, since the gain coefficient $\alpha$ can be larger than $10^4$ cm$^{-1}$, the extinction coefficient $k_3$ of the organic dye layer 3 can be easily changed from 0 to 0.1 (negative value) in accordance with the excitation intensity of the organic dye layer 3.

Figure 9:
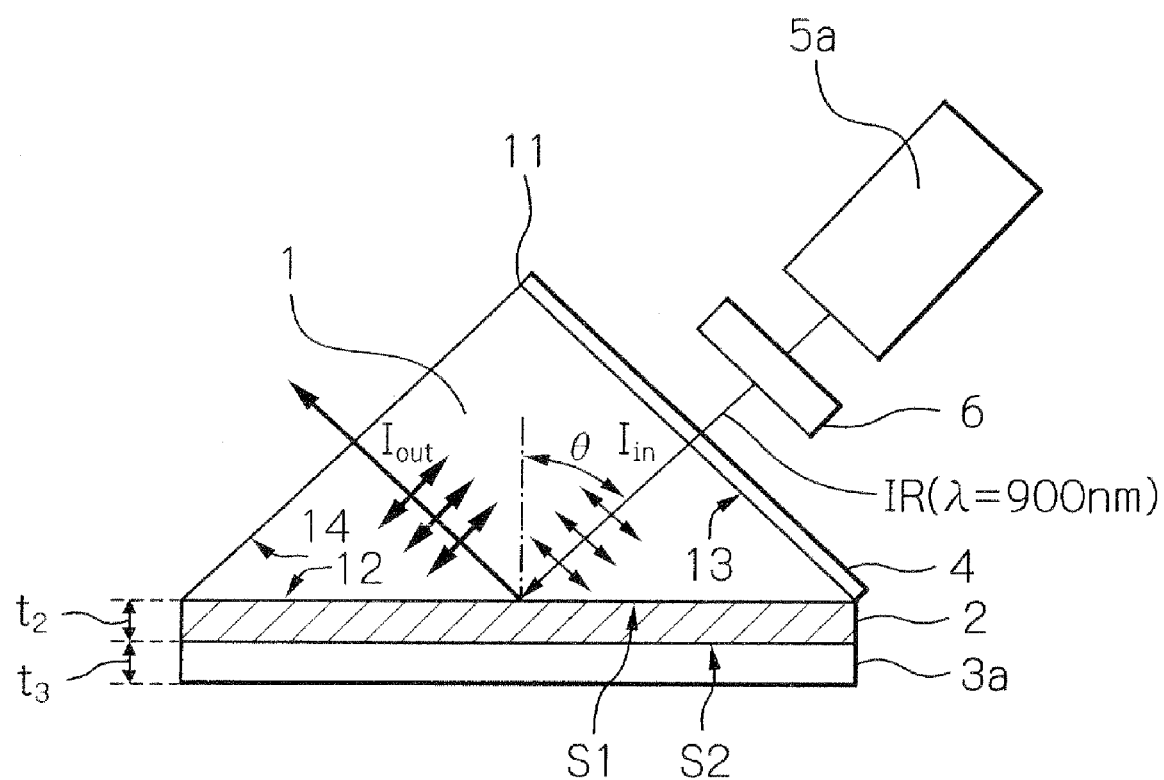
FIG. 9 is a cross-sectional view illustrating a second embodiment of the optical amplifier according to the present invention.

In FIG. 9, which illustrates a second embodiment of the optical amplifier according to the present invention, the organic dye layer 3 of FIG. 3 is replaced by a semiconductor layer such as a GaAs layer 3a, and the He—Ne laser source 5 of FIG. 3 is replaced by an infrared laser source 5a for generating a 900 nm infrared laser ray IR in response to the bandgap of GaAs.

In the Au layer 2, surface plasmon resonance (SPR) photons are excited by incident light, and, in the GaAs layer 3a, a population inversion state is realized by the excitation due to the irradiation of an additional laser ray (pumping light) or a current injection. Therefore, the extinction coefficient $k_{3a}$ of the GaAs layer 3a is made negative. As a result, the output light (reflective light) intensity $I_{out}$ at the incident/reflective surface S1 of the Au layer 2 is about $10^{12}$ times the incident light intensity $I_{in}$ in accordance with the negative extinction coefficient $k_{3a}$ of the GaAs layer 3a. This is considered a resonance state between the SPR photons and the excitation state or population inversion state of the GaAs layer 3a. Also, this output light has a small beam divergence angle.

The operational principle of the optical amplifier of FIG. 9 is the same as that of the optical amplifier of FIG. 3.

Note that, since the wavelength $\lambda$ of the infrared laser ray IR of the infrared laser source 5a is 900 nm and the wavelength of SPR photons of Au is about 600 to 1000 nm, the SPR photons would be excited.

Figure 10:
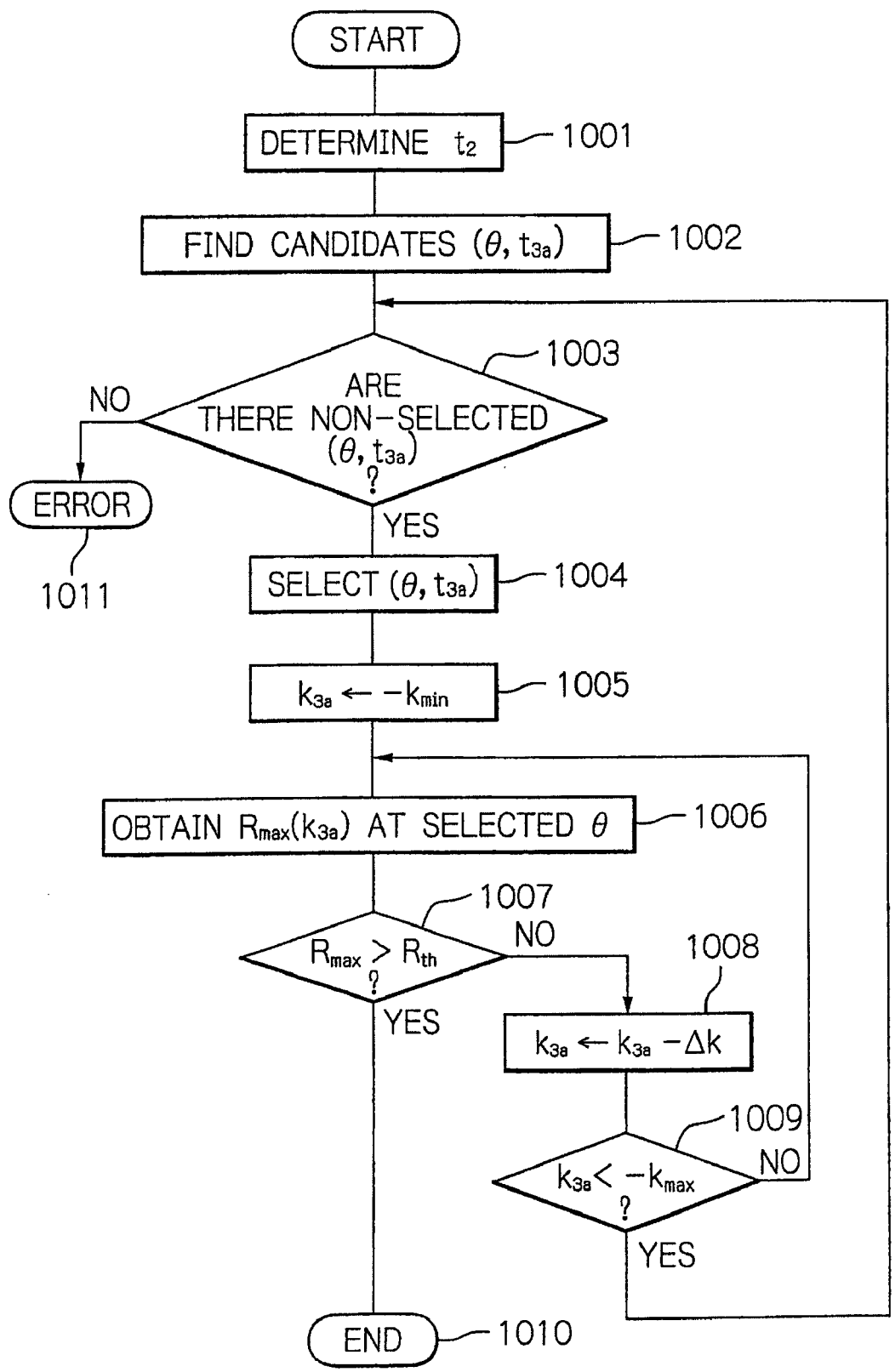
FIG. 10 is a flowchart for explaining a method for manufacturing the optical amplifier of FIG. 9.

FIG. 10 is a flowchart for explaining a method for manufacturing the optical amplifier of FIG. 9.

First, at step 1001, an optimum thickness $t_2$ of the Au layer 2 is determined. That is, if the incident angle $\theta$ of the infrared laser ray IR at the incident/reflective surface S1 of the Au layer 2 is an optimum incident angle $\theta_{op}$ (>$\theta_c$ where $\theta_c$ is a critical angle), the number of SPR photons excited on the surface S2 of the Au layer 2 of FIG. 9 is maximum. In other words, when $\theta=\theta_{opt}>\theta_c$, the reflectivity R at the incident/reflective surface S1 of the Au layer 2 is minimum. In this case, an ATR signal spectrum (not shown) was obtained by a simulation which calculates a reflectivity R of light reflected from the incident/reflective surface S1 of the An layer 2 by angularly scanning the BK-7 prism 1 with the infrared laser ray IR. This simulation can be carried out by the simulation software WinSpall (trademark) developed by Max Planck Laboratory.

In this case, the simulation conditions are as follows:
1) The wavelength $\lambda$ of the infrared laser ray IR is 900 nm.
2) For the BK-7 prism 1,
   the refractive index $n_1$ is 1.535; and
   the extinction coefficient $k_1$ is 0.
3) For the Au layer 2,
   the refractive index $n_2$ is 0.22;
   the extinction coefficient $k_2$ is 6; and
   the thickness $t_2$ is variable.
4) For the GaAs layer 3a,
   the thickness $t_{3a}$ is 0.

That is, the GaAs layer 3a is assumed to be absent.

As a result, the ATR signal spectrum at $t_2$=39 nm shows a sharp plasmon dip where the reflectivity R is 0. Therefore, the thickness $t_2$ of the Au layer 2 is determined to be 39±1 nm, so that the excited SPR photons is maximum.

Figure 11:
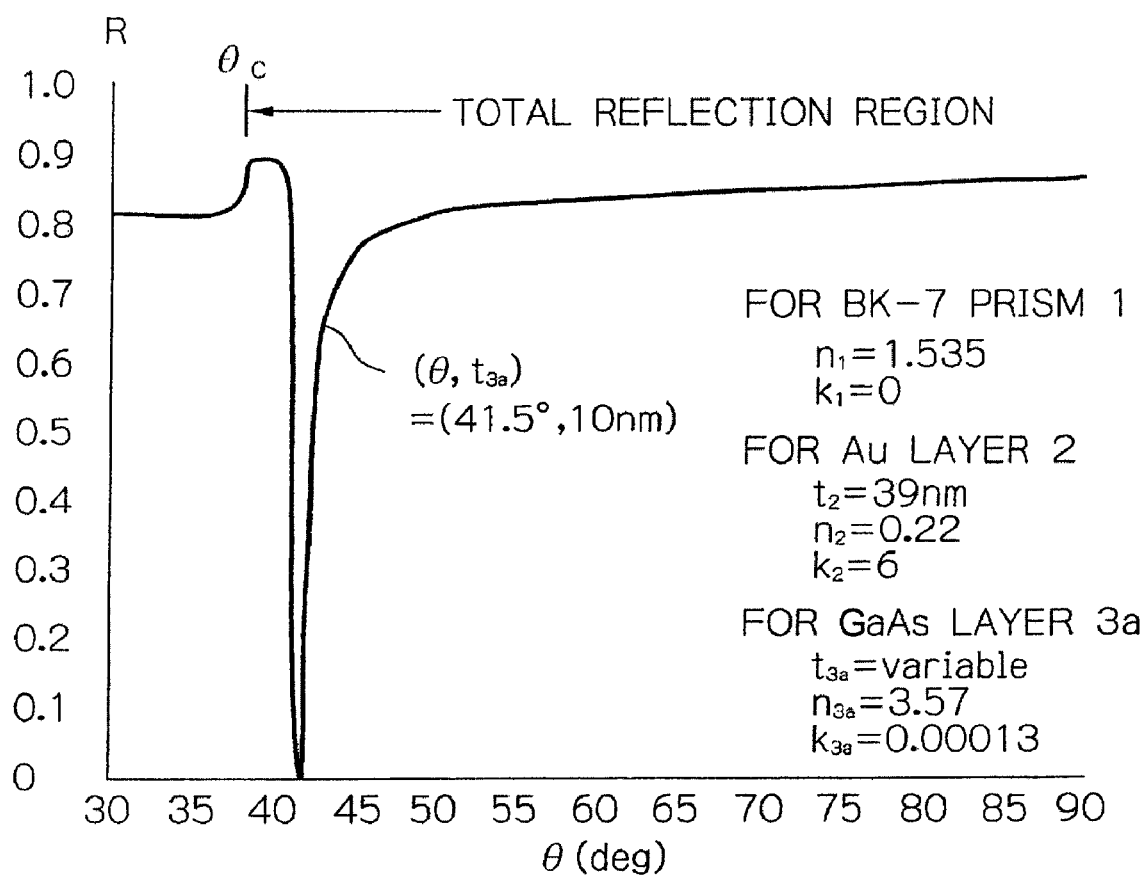
FIG. 11 is an ATR signal spectrum diagram for explaining candidates (the incident angle θ, the thickness $t_{3a}$ of the GaAs layer) at step 1002 of FIG. 10.

Next, at step 1002, candidates ($\theta$, $t_{3a}$) where $\theta$ is the incident angle and $t_{3a}$ is the thickness of the GaAs layer 3a are found. This step is carried out under the condition that the GaAs layer 3a is in a non-excited state ($k_{3a}$=0). FIG. 11 was obtained by a simulation using the above-mentioned simulation software WinSpall (trademark) which calculates a reflectivity R of light reflected from the incident/reflective surface S1 of the Au layer 2 by angularly scanning the BK-7 prism 1 with the infrared laser ray IR where the thickness $t_2$ of the Au layer 2 is fixed at 39 nm while the thickness $t_{3a}$ of the GaAs layer 3a is changed from 0 to 50 nm. In order to simplify the description, only one ATR signal spectrum at $t_{3a}$=10 nm is illustrated in FIG. 11.

In FIG. 11, the simulation conditions are as follows:
1) The wavelength λ of the infrared laser ray IR is 900 nm.
2) For the BK-7 prism 1,
   the refractive index $n_1$ is 1.535; and
   the extinction coefficient $k_1$ is 0.
3) For the Au layer 2,
   the thickness $t_2$ is 39 nm;
   the refractive index $n_2$ is 0.22; and
   the extinction coefficient $k_2$ is 6.
4) For the GaAs layer 3a,
   the thickness $t_{3a}$ is variable;
   the refractive index $n_{3a}$ is 3.57; and
   the extinction coefficient $k_{3a}$ is 0.00013.

As shown in FIG. 11, since the GaAs layer 3a has a little absorption loss ($k_3$=0.00013), when the thickness $t_{3a}$ of the GaAs layer 3a is 10 nm, a sharp plasmon dip is observed at a point of R=0. In order to simplify the description, it is assumed that only the following one candidate ($\theta$, $t_{3a}$) is found:

($\theta$, $t_{3a}$)=(41.5°, 10 nm)

If at least one candidate ($\theta$, $t_{3a}$) is found, the flow proceeds from step 1003 to step 1004 which selects one candidate ($\theta$, $t_{3a}$). Otherwise, the flow proceeds from step 1003 to step 1011 which indicates an error.

That is, step 1003 determines whether there are still non-selected candidates among the candidates ($\theta$, $t_{3a}$) found at step 1002. If there is at least one non-selected candidate ($\theta$, $t_{3a}$), the flow proceeds to step 1004 which selects one candidate ($\theta$, $t_{3a}$) from the non-selected candidates, and then, steps 1005 through 1009 determine the extinction coefficient $k_{3a}$ of the GaAs layer 3a, i.e., determines ($\theta$, $t_{3a}$, $k_{3a}$).

Note that the extinction coefficient $k_{3a}$ of the GaAs layer 3a is defined by the intensity of its population inversion state which can be realized by irradiating the GaAs layer 3a with an additional pumping laser ray or injecting a current into the GaAs layer 3a. That is, the extinction coefficient $k_{3a}$ of the GaAs layer 3a is defined by $$k_{3a} = \eta_2 \cdot I$$

where I is the energy of the pumping laser ray or the injected current; and
$\eta_2$ is a constant.

At step 1005, the extinction coefficient $k_{3a}$ of the GaAs layer 3a is initialized at $-k_{min}$ where $k_{min}$ is a positive value such as 0.001.

Next, at step 1006, a reflectivity $R_{max}$ at the selected incident angle $\theta$ is obtained. For example, an ATR signal spectrum ($\theta$, $t_{3a}$, $k_{3a}$) using the above-mentioned simulation software WinSpall (trademark) is calculated, and the reflectivity $R_{max}$ at the selected incident angle $\theta$ is obtained from this ATR signal spectrum. In this case, the reflectivity $R_{max}$ at the selected incident angle $\theta$ can be obtained by directly observing the reflectivity $R_{max}$.

Next, at step 1007, it is determined whether or not $R_{max} > R_{th}$ where $R_{th}$ is a predetermined value such as 6E4 is satisfied. As a result, only when $R_{max} > R_{th}$, does the flow proceed to step 1010 which completes the flowchart of FIG. 10. On the other hand, when $R_{max} \leq R_{th}$, the flow proceeds to steps 1008 and 1009 which renew the extinction coefficient $k_{3a}$ by decreasing the extinction coefficient $k_{3a}$ by $\Delta k$ such as 0.001, thus repeating the flow at steps 1006 and 1007. In this case, the extinction coefficient $k_{3a}$ is guarded by step 1009. That is, when $k_{3a} \geq -k_{max}$ where $k_{max}$ is a definite value such as 1.0, the flow proceeds from step 1009 to steps 1006 and 1007. On the other hand, the flow proceeds from step 1009 to step 1003.

Thus, when the extinction coefficient $k_{3a}$ of the GaAs layer 3a is changed from $k_{min}$ n to $k_{max}$, the extinction coefficient $k_{3a}$ is determined at the time when the reflectivity R reaches $R_{th}$.

Note that, when it is determined that there is no non-selected candidate ($\theta$, $t_{3a}$) at step 1003, the flow proceeds to step 1011, which means it is impossible to determine the extinction coefficient $k_{3a}$ of the GaAs layer 3a.

Figure 12:
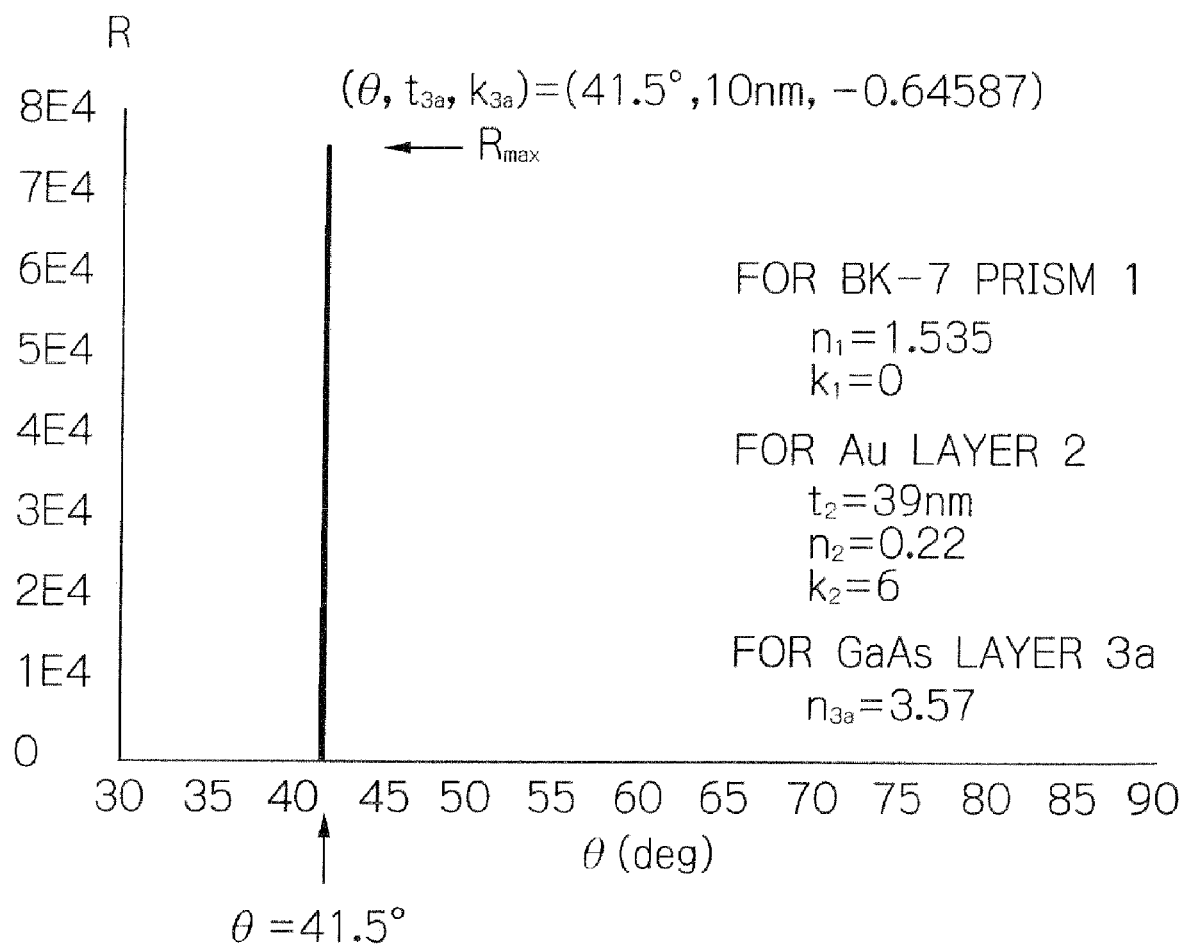
FIG. 12 is an ATR signal spectrum diagram for explaining the reflectivity $R_{max}$ at the selected incident angle at step 1006 of FIG. 10.

For example, when ($\theta$, $t_{3a}$)=(41.5°, 10 nm) is selected at step 1004 and $k_{3a}$=−0.64587 is obtained at step 1008, an ATR signal spectrum as illustrated in FIG. 12 is obtained. In this case, the reflectivity $R_{max}$ at the selected incident angle $\theta$(=41.5°) is large, so that the flow proceeds via to step 1010.

Thus, ($\theta$, $t_{3a}$, $k_{3a}$)=(41.5°, 10 nm, −0.64587) is finally determined.

In FIG. 12, note that the simulation conditions are as follows:
1) The wavelength λ of the infrared laser ray IR is 900 nm.
2) For the BK-7 prism 1,
   the refractive index $n_1$ is 1.535; and
   the extinction coefficient $k_1$ is 0.
3) For the Au layer 2,
   the refractive index $n_2$ is 0.22;
   the extinction coefficient $k_2$ is 6; and
   the thickness $t_2$ is 39 nm.
4) For the GaAs layer 3a,
   the refractive index $n_{3a}$ is 3.57.

As stated above, the extinction coefficient $k_{3a}$ of the GaAs layer 3a can be easily changed from 0 to −0.1 (negative value) in accordance with the excitation intensity of the GaAs layer 3a.

Figure 13:
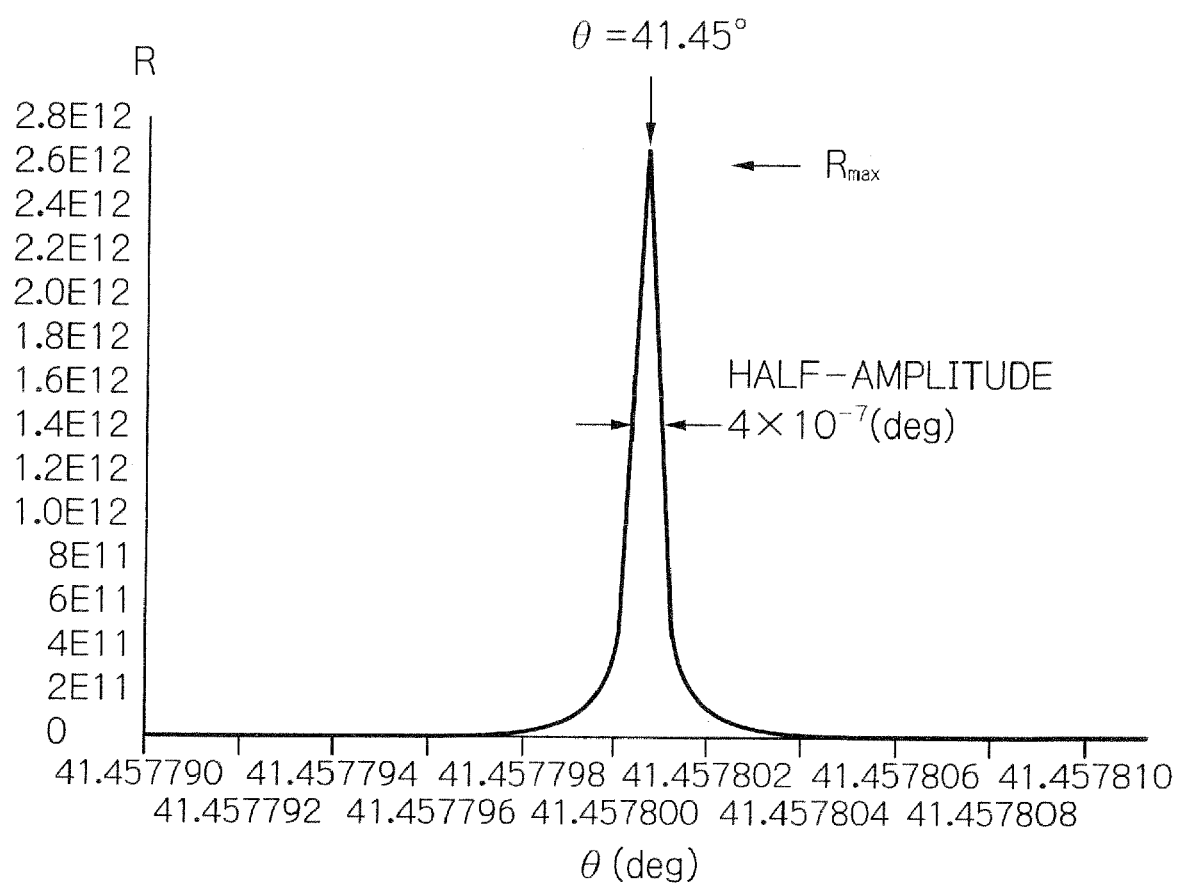
FIG. 13 is an enlargement of the reflection spectrum of FIG. 12.

As illustrated in FIG. 13, which is an enlargement of the reflection spectrum of FIG. 12, this reflection spectrum is an extremely-sharp δ-function. That is, when the thickness $t_{3a}$ of the GaAs layer 3a is 10 nm and the plasmon dip angle $\theta$ is 41.5°, actually, 41.45°, and the extinction coefficient $k_{3a}$ of the GaAs layer 3a is −0.64587, the output light (reflective light) intensity $I_{out}$ at the incident/reflective surface S1 of the Au layer 2 is about $10^{12}$ times the incident light intensity $I_{in}$. Therefore, ($\theta$, $t_{3a}$, $k_{3a}$)=(41.5°, 10 nm, −0.64587) is determined.

As stated above, the above-mentioned value $10^{12}$ of the ratio of the output light (reflective light) intensity $I_{out}$ to the incident light intensity $I_{in}$ is not maximum. Note that this value corresponds to an oscillation state and, therefore. is theoretically indefinite. However, as the output light (reflective light) intensity $I_{out}$ is increased, the non-linear loss such as the induced scattering is increased, so that the output light (reflective light) intensity $I_{out}$, i.e., the above-mentioned ratio is not indefinite.

Also, the output light has a small beam divergence angle. Generally, a very long resonator structure is needed to obtain such a small beam divergence angle. However, the resonator structure of the optical amplifier of FIG. 9 is only 100 nm long.

Figure 14:
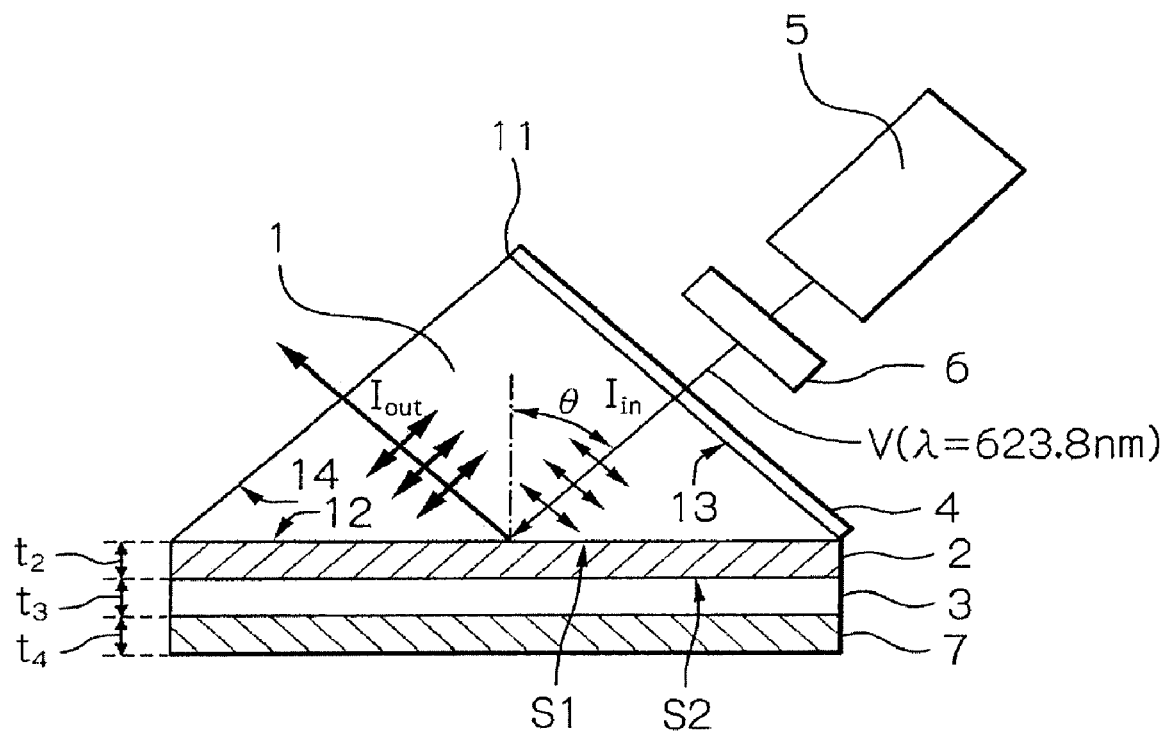
FIG. 14 is a cross-sectional view illustrating a third embodiment of the optical amplifier according to the present, invention.

In FIG. 14, which illustrates a third embodiment of the optical amplifier according to the present invention, a silver (Ag) layer 7 serving as a resonator layer is added to the elements of the optical amplifier of FIG. 3. In this case, the Ag layer 7 is deposited on the surface of the organic dye layer 3 opposing the surface S2 of the Au layer 2.

In FIG. 14, it is assumed that the organic dye layer 3 is excited by an additional pumping ultraviolet laser ray having a wavelength λ of 320 nm. In this case, the Ag layer 7 has a high reflectivity to the visible laser ray V (λ=623.8 nm), while the Ag layer 7 has a low reflectivity or a high transmittance to the additional pumping ultraviolet laser ray (λ=320 nm). Therefore, the Ag layer 7 has a selective reflectivity, and therefore, the Ag layer 7 can serve as a resonator layer.

The operational principle of the optical amplifier of FIG. 14 is that the visible laser ray V is incident to the Au layer 2, and a part of the visible laser ray V transmitted via the organic dye layer 3 to the Ag layer 7 is reflected by the Ag layer 7. On the other hand, the organic dye layer 3 is excited by the ultraviolet laser ray transmitted from the Ag layer 7. As a result, evanescent photons are generated in the Au layer 2 by the visible laser ray V incident thereto and reflected from the Ag layer 7 to excite photons on the surface S2 of the Au layer 2. In this case, since the visible laser ray V is P-polarized, the visible laser ray V has an electric field component in parallel with the surface of the Au layer 2 and another electric field perpendicular to the surface of the Au layer 2, so that the respective electric fields are amplified. For example, the intensity of the electric field of a light incident to the Au layer 2 is about twenty times by the SPR photons generated therein. Therefore, since the intensity of the light incident to the Au layer 2 is represented by a square value of the electric field, the light incident to the Au layer 2 is amplified by about 400 (=20×20) times.

Even in the optical amplifier of FIG. 14, since the wavelength λ of the visible laser ray V of the He—Ne laser source 5 is 632.8 nm and the wavelength of SPR photons of Au is about 600 to 1000 nm, the SPR photons would be excited.

Figure 15:
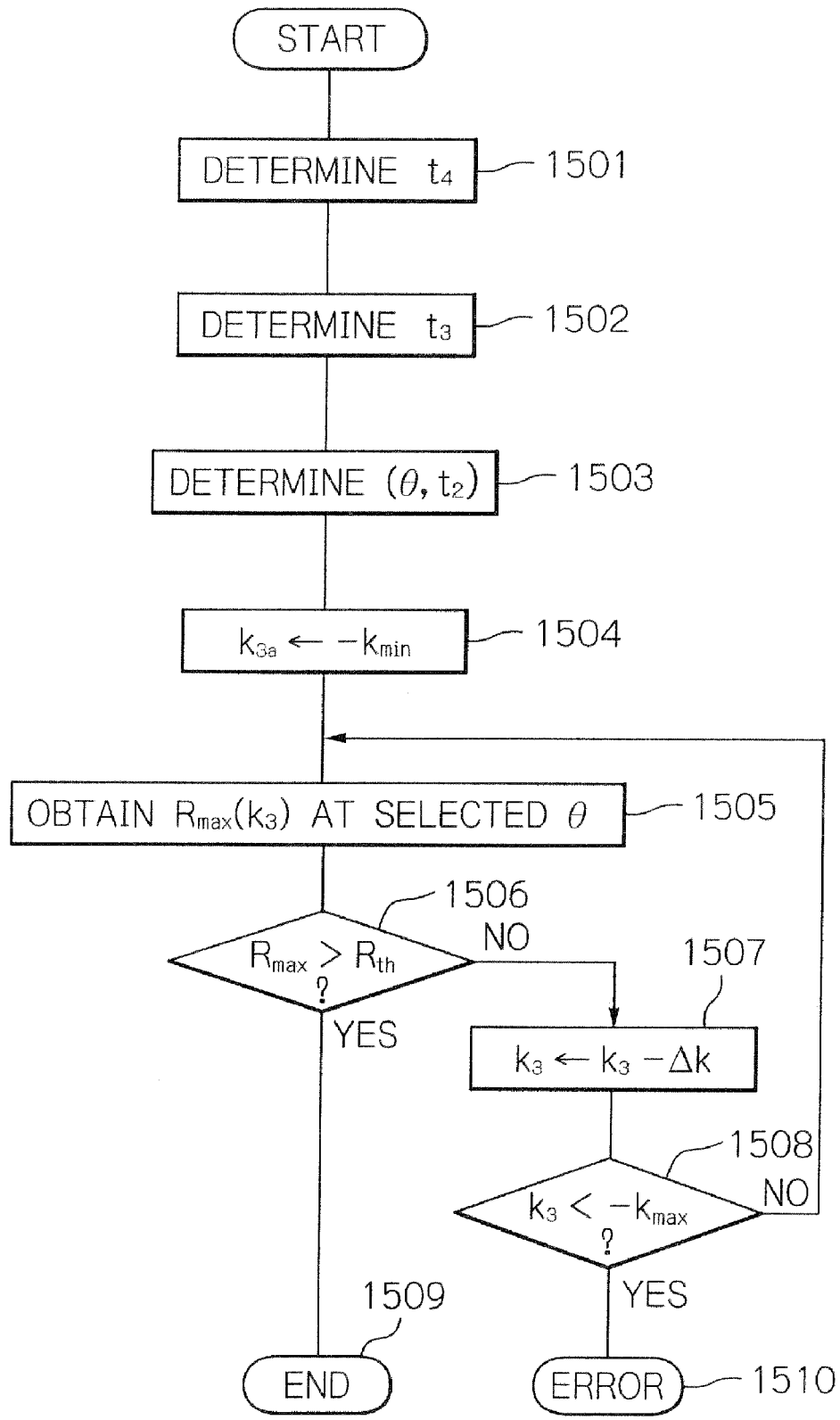
FIG. 15 is a flowchart for explaining a method for manufacturing the optical amplifier of FIG. 14.

FIG. 15 is a flowchart for explaining a method for manufacturing the optical amplifier of FIG. 14.

First, at step 1501, the thickness thd 4, of the Ag layer 7 is determined, so that the transmittivity of the Ag layer 7 to the ultraviolet laser ray (λ=320 nm) is a predetermined value such as about 70 to 80%. For example, the thickness $t_4$ of the Ag layer 7 is determined to be 10 nm to realize the above-mentioned transmittivity.

Next, at step 1502, the thickness $t_3$ of the organic dye layer 3 is determined. For example, the thickness $t_3$ of the organic dye layer 3 is determined to be 50 nm in view of the above-described first embodiment. That is, since the organic dye layer 3 has no absorption loss ($k_3$=0), when the thickness $t_3$ of the organic dye layer 3 is increased, the plasmon dip angle is shifted toward a higher angle where the depth of the plasmon dip is at a point of R=0, so that SPR photons can be excited regardless of the thickness $t_3$ of the non-excited organic dye layer 3. However, the plasmon dip angle should be smaller than 90°. Note that, if $t_3$=200 nm, the plasmon dip angle is beyond 90°.

Next, at step 1503, (θ, $t_2$) where θ is an optimum incident angle and $t_2$ is the thickness of the Au layer 2 is determined. That is, if the incident angle θ of the visible laser ray V at the incident/reflective surface S1 of the Au layer 2 is an optimum incident angle $θ_{opt}$ (>θ, where θ, is a critical angle), the number of SPR photons excited on the surface S2 of the Au layer 2 of FIG. 14 is maximum. In other words, when $θ=θ_{opt}>θ_c$, the reflectivity R at the incident/reflective surface S1 of the Au layer 2 is minimum. In this case, FIG. 16 was obtained by a simulation which calculates a reflectivity R of light reflected from the incident/reflective surface S1 of the Au layer 2 by angularly scanning the BK-7 prism 1 with the visible laser ray V. This simulation can be carried out by the above-mentioned simulation software WinSpall (trademark). From FIG. 16, (θ, $t_2$)=(46.5°, 39 nm) is determined.

Figure 16:
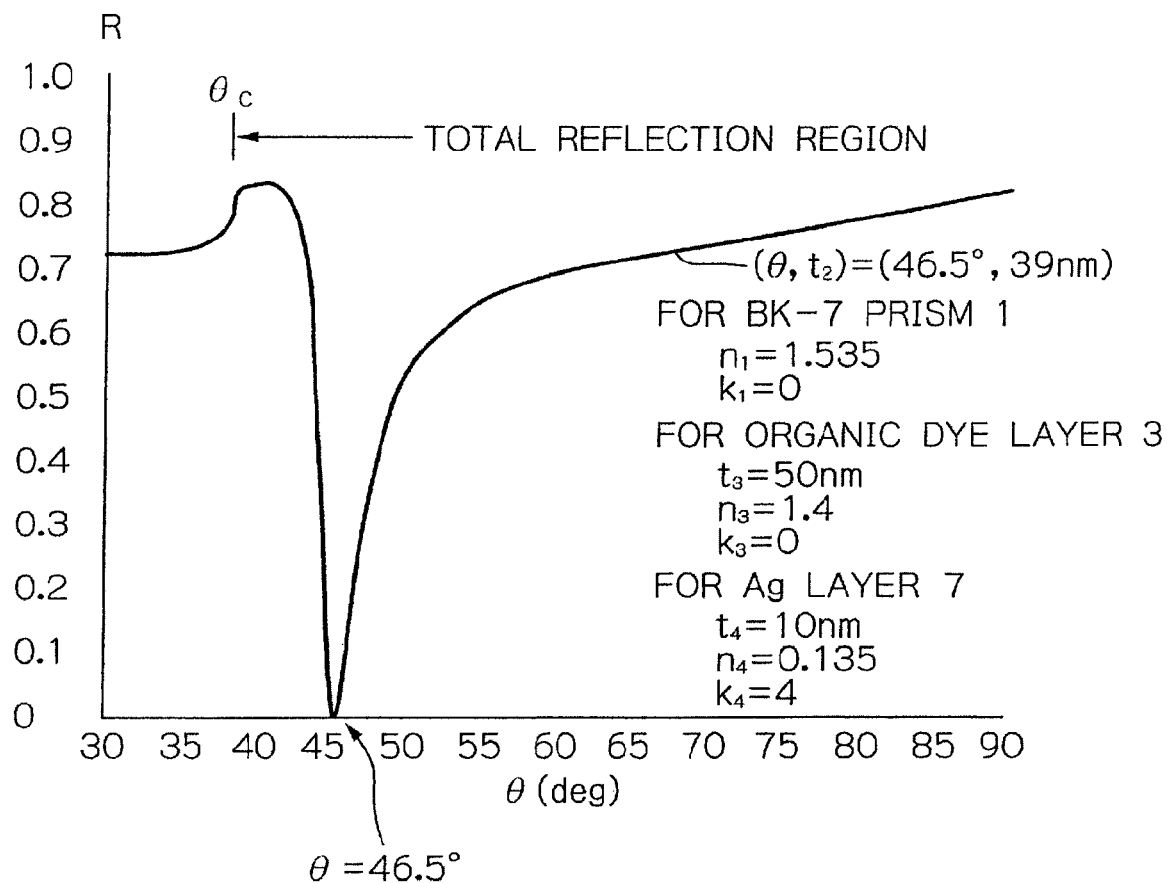
FIG. 16 is an ATR signal spectrum diagram for explaining (the incident angle θ, the thickness 12 of the Au layer) at step 1503 of FIG. 15.

In FIG. 16, the simulation conditions are as follows:
1) The wavelength λ of the visible laser ray V is 632.8 nm.
2) For the BK-7 prism 1,
   the refractive index $n_1$ is 1.535; and
   the extinction coefficient $k_1$ is 0.
3) For the Au layer 2,
   the refractive index $n_2$ is 0.18;
   the extinction coefficient $k_2$ is 3; and
   the thickness $t_2$ is variable.
4) For the organic dye layer 3,
   the refractive index $n_3$ is 1.4;
   the extinction coefficient $k_3$ is 0; and
   the thickness $t_3$ is 50 nm.

Next, at steps 1504 to 1510, the extinction coefficient $k_3$ of the organic dye layer 3 is determined so as to obtain a desired reflectivity $R_{max}$ at the incident/reflective surface S1 of the Au layer 2. Even in this case, the extinction coefficient $k_3$ of the organic dye layer 3 is defined by the intensity of its population inversion state which can be realized by irradiating the organic dye layer 3 with an additional pumping laser ray or injecting a current into the organic dye layer 3. That is, the extinction coefficient $k_3$ of the organic dye layer 3 is defined by $$k_3 = \eta_3 \cdot I$$

where I is the energy of the pumping laser ray or the injected current; and $\eta_3$ is a constant. In the resonator structure of FIG. 14, $\eta_3$ is larger than $\eta_1$ and $\eta_2$.

Steps 1505 to 1510 will be explained below in detail.

At step 1505, the extinction coefficient $k_3$ of the organic dye layer 3 is initialized at $-k_{min}$ where $k_{min}$ is a positive value such as 0.001.

Next, at step 1506, a reflectivity $R_{max}$ at the selected incident angle θ is obtained. For example, an ATR signal spectrum (θ, $t_3$, $k_2$) using the above-mentioned simulation software WinSpall (trademark) is calculated, and the reflectivity $R_{max}$ at the selected incident angle θ is obtained from this ATR signal spectrum. In this case, the reflectivity $R_{max}$ at the selected incident angle θ can be obtained by directly observing the reflectivity $R_{max}$.

Next, at step 1507, it is determined whether or not $R_{max}>R_{th}$ where $R_{th}$ is a predetermined value such as 6E4 is satisfied. As a result, only when $R_{max}>R_{th}$, does the flow proceed to step 1509 which completes the flowchart of FIG. 15. On the other hand, when $R_{max} \leq R_{th}$, the flow proceeds to steps 1507 and 1508 which renew the extinction coefficient $k_2$ by decreasing the extinction coefficient $k_3$ by Δk such as 0.001, thus repeating the flow at steps 1505 and 1506. In this case, the extinction coefficient $k_3$ is guarded by step 1508. That is, when $k_3 \geq -k_{max}$ where $k_{max}$ is a definite value such as 1.0, the flow proceeds from step 1508 to steps 1505 and 1506. On the other hand, the flow proceeds from step 1508 to step 1510, which indicates an error.

Thus, the extinction coefficient $k_3$ of the organic dye layer 3 is changed from $k_{min}$ to $k_{max}$, the extinction coefficient $k_3$ is determined at the time when the reflectivity $R_{max}$ reaches $R_{th}$.

Figure 17:
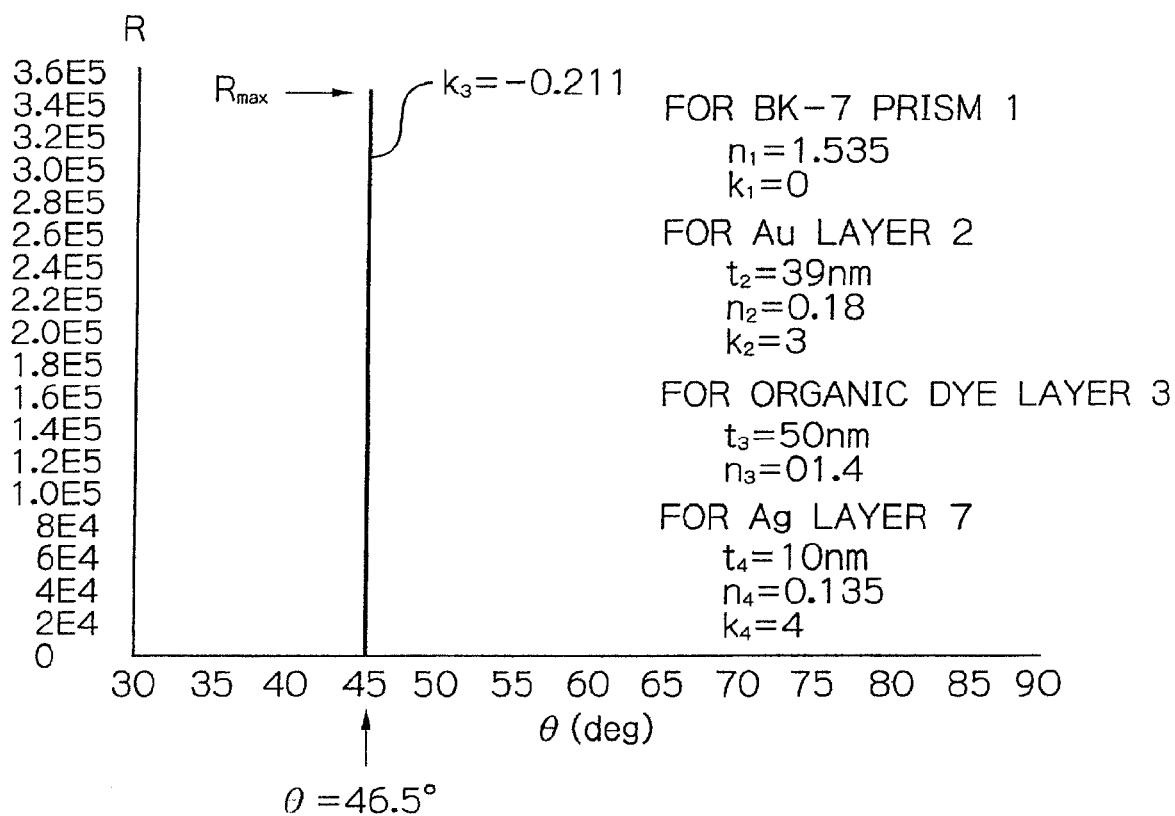
FIG. 17 is an ATR signal spectrum diagram for explaining the reflectivity $R_{max}$ at the selected incident angle at step 1505 of FIG. 15.

For example, when $k_3$=−0.211 is obtained at step 1507, an ATR signal spectrum as illustrated in FIG. 17 is obtained. In this case, the reflectivity $R_{max}$ at the selected incident angle θ(=46.5°) is large, i.e., $R_{max}>R_{th}$, so that the flow proceeds to step 1509.

Thus, $k_3$=−0.211 is finally determined.

In FIGS. 16 and 17, note that the simulation conditions are as follows:
1) The wavelength λ of the visible laser ray V is 632.8 nm.
2) For the BK-7 prism 1,
   the refractive index $n_1$ is 1.535; and
   the extinction coefficient, $k_1$ is 0.
3) For the Au layer 2,
   the refractive index $n_2$ is 0.18;
   the extinction coefficient $k_2$ is 3; and
   the thickness $t_2$ is 39 nm.
4) For the organic dye layer 3,
   the refractive index $n_3$ is 1.4.

Thus, under the presence of the Ag layer 7 serving as a resonator layer, the extinction coefficient $k_3$ of the organic dye layer 3 can be easily changed from 0 to −0.1 (negative value) in accordance with the excitation intensity of the organic dye layer 3.

As illustrated in FIG. 17, when the extinction coefficient $k_3$ of the organic dye layer 3 at the plasmon dip angle θ=46.5° (actually, 46.3°) of FIG. 16 is −0.211, the output light (reflective light) intensity $I_{out}$ at the incident/reflective surface S1 of the Au layer 2 is about $10^5$ times the incident light intensity $I_{in}$.

Note that, instead of the Ag layer 7, a dielectric multi-layer mirror structure such as $SiO_2/TiO_2$ having a selective reflectivity can be used as a resonator layer.

Figure 18A:
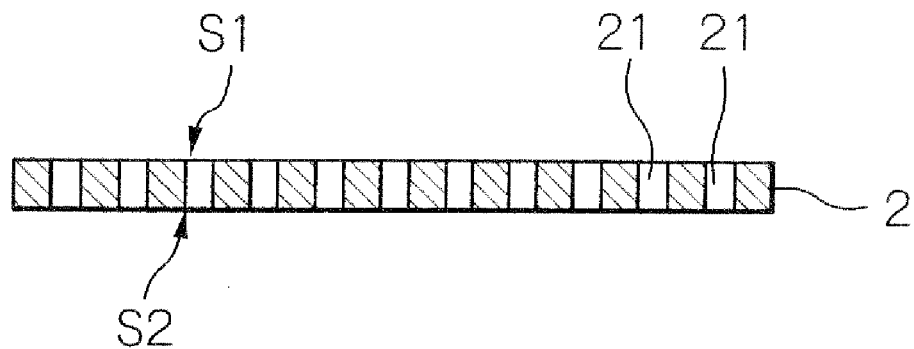
FIG. 18A is a cross-sectional view of a modification of the Au layer of FIGS. 3, 9 and 14.

FIG. 18A is a cross-sectional view illustrating a modification of the Au layer 2 of FIGS. 3, 9 and 14, and FIG. 18B is a plan view of the modification of FIG. 18A.

Figure 18B:
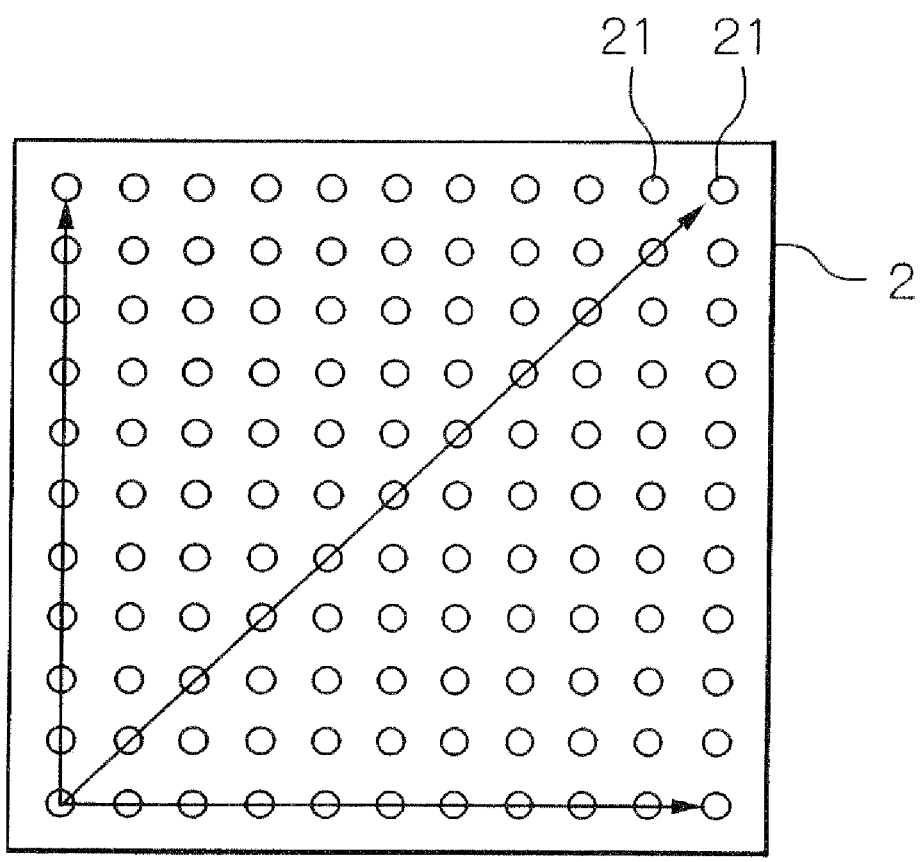
FIG. 18B is a plan view of the modification of FIG. 18A.

As illustrated in FIGS. 18A and 18B, holes 21 are regularly perforated in the Au layer 2. In this case, the holes 21 have a diameter smaller than the wavelength λ of the visible laser ray V (or the infrared laser ray IR). Therefore, when the visible laser ray V (or the infrared laser ray IR) is incident to the incident/reflective surface S1 of the Au layer 2, a part of the visible laser ray V (or the infrared laser ray IR) is incident into the holes 21, so that this part is hardly radiated from the holes 21 due to the small diameter thereof, while evanescent photons are generated in the Au layer 2. This phenomenon is known as means for generating evanescent photons using very small holes. Additionally, as indicated by arrows in FIG. 18B, evanescent photons generated in one of the holes 21 propagate into an adjacent one of the holes 21 to enhance the intensity of the evanescent photons. As a result, SPR photons are easily excited on the photoelectric surface S2 of the Au layer 2 by the enhanced evanescent photons.

In the above-described embodiments, the additional laser source for generating pumping light can be pulsated so as to pulsate the output light (reflective light). That is, when the pumping light applied to the dielectric layer such as the organic dye layer 3 or the GaAs layer 3a is pulsated, to realize a population inversion state or a negative extinction coefficient state therein, the output light (reflective light) would have a sharp peak. For example, in the optical amplifier of FIG. 9, a pulse output light having a peak value of 1 GW can be obtained for 1 mW incident light.

Also, in the above-described embodiments, since the Au layer 2 for generating SPR photons can serve as an electrode, a current injection into the dielectric layer can be easily carried out by using the Au layer 2 as such an electrode. Particularly, in the optical amplifier of FIG. 14, the Au/dielectric layer/Ag resonator structure resembles a structure for injecting a current into the dielectric layer.

Further, when the present invention is applied to an infrared light emitting device with a high population inversion state which has a high internal quantum efficiency and a low external quantum efficiency, an output light (reflective light) can be extracted from the device at an efficiency of about 100%.

Note that the above-mentioned flowcharts of FIGS. 4, 10 and 15 can be stored in a read-only memory (ROM) or another nonvolatile memory or in a random access memory (RAM) or another volatile memory.

The invention claimed is:

1. An optical amplifier, comprising:
a metal layer having an incident/reflective surface adapted to receive incident light and output reflective light thereof;
a dielectric layer formed on an opposite surface of said metal layer opposing said incident/reflective surface, said dielectric layer comprising one of an organic dye layer and a semiconductor layer; and
a transparent body attached to said incident/reflective surface of said metal layer;
wherein said incident light excites surface plasmon resonance light in said metal layer while said dielectric layer is controlled to be excited so that an extinction coefficient of said dielectric layer is made negative.

2. The optical amplifier as set forth in claim 1, wherein an incident angle of said incident light to said metal layer is a light absorption dip angle by which a reflectivity of said incident light at said incident/reflective surface of said metal layer is at a minimum in a total reflection region while said dielectric layer is not excited.

3. The optical amplifier as set forth in claim 1, wherein a thickness of said metal layer is determined so that a reflectivity of said incident light at said incident/reflective surface of said metal layer is at a minimum when said incident light is incident at said light absorption dip angle to said incident/reflective surface of said metal layer while said dielectric layer is not excited.

4. The optical amplifier as set forth in claim 1, wherein said transparent body comprises a prism.

5. The optical amplifier as set forth in claim 4, wherein a first surface of said prism on which said metal layer is formed opposes an arris of said prism.

6. The optical amplifier as set forth in claim 5, wherein said prism has second and third surfaces forming an arris thereof, said optical amplifier further comprising an anti-reflection coating layer formed on said second surface of said prism, said incident light being incident through said anti-reflection coating layer to said prism.

7. The optical amplifier as set forth in claim 1, wherein said metal layer comprises a gold (Au) layer.

8. The optical amplifier as set forth in claim 1, further comprising a resonator layer deposited on an opposite surface of said dielectric layer opposing said metal layer.

9. The optical amplifier as set forth in claim 8, wherein said resonator layer comprises a silver (Ag) layer.

10. The optical amplifier as set forth in claim 8, wherein said resonator layer comprises a dielectric multi-layer mirror structure.

11. The optical amplifier as set forth in claim 1, wherein a plurality of holes are perforated in said metal layer, a diameter of each of said holes being smaller than a wavelength of said incident light.

12. The optical amplifier as set forth in claim 11, wherein said holes are regularly arranged in said metal layer.

13. The optical amplifier as set forth in claim 1, wherein said incident light has a pulse width of longer than 10 femto seconds.

14. The optical amplifier as set forth in claim 1, wherein excitation of said dielectric layer is carried out by injection of a pulsated current therein.

15. A method for manufacturing an optical amplifier which comprises (i) a metal layer having an incident/reflective surface adapted to receive incident light and output reflective light thereof, (ii) a dielectric layer deposited on an opposite surface of said metal layer opposing said incident/reflective surface, said dielectric layer comprising one of an organic dye layer and a semiconductor layer, and (iii) a transparent body attached to said incident/reflective surface of said metal layer, wherein said incident light excites surface plasmon resonance light in said metal layer while said dielectric layer is controlled to be excited so that an extinction coefficient of said dielectric layer is made negative, wherein said method comprises:

determining a thickness of said metal layer, so that the reflectivity of said incident light at said incident/reflective surface of said metal layer is minimum in a total reflection region when said incident light is incident to said incident/reflective surface of said metal layer while said dielectric layer is not excited;

determining at least one candidate of an incident angle of said incident light to said metal layer and a thickness of said dielectric layer, so that the reflectivity of said incident light at said incident/reflective surface of said metal layer is minimum in said total reflection region while said determined thickness of said metal layer is maintained and said dielectric layer is not excited; and determining a negative extinction coefficient of said dielectric layer corresponding to a controlled excited state of said dielectric layer, so that the reflectivity of said incident light at said incident angle of said candidate is beyond a predetermined value while said thickness of said dielectric layer of said candidate is maintained.

16. A method for manufacturing an optical amplifier which comprises (i) a metal layer having an incident/reflective surface adapted to receive incident light and output its reflective light, (ii) a dielectric layer deposited on an opposite surface of said metal layer opposing said incident/reflective surface, said dielectric layer comprising one of an organic dye layer and a semiconductor layer, (iii) a transparent body attached to said incident/reflective surface of said metal layer, and (iv) a resonator layer deposited on an opposite surface of said dielectric layer opposing said metal layer, wherein said incident light excites surface plasmon resonance light in said metal layer while said dielectric layer is controlled to be excited so that an extinction coefficient of said dielectric layer is made negative, said method comprising:

determining a thickness of said resonator layer in accordance with a predetermined transmittivity of said resonator layer;

determining a thickness of said dielectric layer;

determining an incident angle of said incident light at said incident/reflective surface of said metal layer and a thickness of said metal layer, so that the reflectivity of said incident light at said incident/reflective surface of said metal layer is minimum in a total reflection region when said incident light is incident to said incident/reflective surface of said metal layer while said dielectric layer is not excited; and determining a negative extinction coefficient of said dielectric layer corresponding to a controlled excited state of said dielectric layer, so that the reflectivity of said incident light at said incident angle is beyond a predetermined value while said incident angle of said incident light at said incident/reflective surface of said metal layer and said thickness of said dielectric layer are maintained.

* * * * *